(12) United States Patent
Ulmer et al.

(10) Patent No.: US 12,401,252 B2
(45) Date of Patent: Aug. 26, 2025

(54) HOUSING WITH A HOUSING PART COMPRISING AN INTEGRATED PROTECTIVE SECTION

(71) Applicant: ElringKlinger AG, Dettingen (DE)

(72) Inventors: Benjamin Ulmer, Bad Urach (DE); Jochen Schoellhammer, Dettingen (DE); Tobias Kunert, Neckartenzlingen (DE); Bodo Golchert, Wolfschlugen (DE); Bernhard Eberle, Metzingen (DE); Bjoern Betz, Trochtelfingen (DE)

(73) Assignee: ElringKlinger AG (DE)

( * ) Notice: Subject to any disclaimer, the term of this patent is extended or adjusted under 35 U.S.C. 154(b) by 225 days.

(21) Appl. No.: 17/961,313

(22) Filed: Oct. 6, 2022

(65) Prior Publication Data
US 2023/0032158 A1    Feb. 2, 2023

Related U.S. Application Data

(63) Continuation of application No. PCT/EP2021/057831, filed on Mar. 25, 2021.

(30) Foreign Application Priority Data

Apr. 8, 2020 (DE) .......................... 102020109898.7

(51) Int. Cl.
*H02K 5/22* (2006.01)
*H05K 9/00* (2006.01)

(52) U.S. Cl.
CPC ........... *H02K 5/225* (2013.01); *H05K 9/0049* (2013.01)

(58) Field of Classification Search
CPC ........ H05K 5/0052; H05K 5/03; H05K 5/061; H05K 9/0009; H05K 9/0049; H02K 5/225
See application file for complete search history.

(56) References Cited

U.S. PATENT DOCUMENTS

| | | | | |
|---|---|---|---|---|
| 2,573,600 A | * | 10/1951 | Pruehs | H02G 3/0633 16/2.5 |
| 2,667,368 A | * | 1/1954 | Ferguson | H02G 3/0633 24/135 R |
| 2,895,003 A | * | 7/1959 | Rapata | H02G 3/0633 16/2.5 |
| 3,141,062 A | * | 7/1964 | Rapata | F16L 5/00 174/153 G |

(Continued)

FOREIGN PATENT DOCUMENTS

| | | |
|---|---|---|
| DE | 1784276 U | 3/1959 |
| DE | 8909674 U1 | 11/1989 |

(Continued)

*Primary Examiner* — Timothy J Thompson
*Assistant Examiner* — Rhadames Alonzo Miller
(74) *Attorney, Agent, or Firm* — Reinhart Boerner Van Deuren

(57) ABSTRACT

In order to improve a housing, in particular for an electrotechnical apparatus, comprising at least two housing parts which each have a connecting face, said connecting faces, in a closed state of the housing, facing one another along a connecting section, it is proposed that at least one of the at least two housing parts, along the connecting section, has at least one integrated protective section, in particular for EMC shielding and/or for mechanical protection.

30 Claims, 16 Drawing Sheets

(56) References Cited

U.S. PATENT DOCUMENTS

| | | | | | |
|---|---|---|---|---|---|
| 3,672,103 | A | * | 6/1972 | Kost | H02G 9/10 174/37 |
| 3,751,579 | A | * | 8/1973 | Nojiri | F16L 5/00 174/650 |
| 3,809,798 | A | * | 5/1974 | Simon | H02G 3/0633 174/59 |
| 3,858,160 | A | * | 12/1974 | Denton | H01B 17/58 439/459 |
| 3,879,571 | A | * | 4/1975 | Reed | H02G 3/0633 439/456 |
| 3,958,300 | A | * | 5/1976 | Tanaka | F16L 5/00 439/459 |
| 3,986,228 | A | * | 10/1976 | Dowse | H02G 3/0633 410/105 |
| 4,125,238 | A | * | 11/1978 | Tanaka | H02G 3/0633 16/2.5 |
| 4,162,561 | A | * | 7/1979 | Tillemans | H02G 3/0633 24/134 P |
| 4,167,301 | A | * | 9/1979 | Mundschenk | H02G 3/0633 439/457 |
| 4,178,057 | A | * | 12/1979 | McCormick | H02G 3/065 439/459 |
| 4,265,420 | A | * | 5/1981 | McCormick | H02G 3/0633 174/153 G |
| 4,487,386 | A | * | 12/1984 | Hehl | H02G 3/0633 174/153 G |
| 4,493,467 | A | * | 1/1985 | Borja | H02G 3/0633 174/153 G |
| 4,850,014 | A | * | 7/1989 | Gillis | H04Q 1/028 D14/240 |
| 4,857,674 | A | * | 8/1989 | Filbert | H02G 3/0633 403/252 |
| 4,886,938 | A | * | 12/1989 | Rottmar | H02G 3/0633 174/559 |
| 5,205,758 | A | * | 4/1993 | Comerci | H02G 3/125 439/535 |
| 5,304,742 | A | * | 4/1994 | Filbert | H02G 3/0633 24/458 |
| 5,419,165 | A | * | 5/1995 | Perkins | E05B 67/383 292/288 |
| 5,563,378 | A | * | 10/1996 | Uchida | H02K 5/225 174/151 |
| 5,600,091 | A | * | 2/1997 | Rose | H05K 9/0015 174/374 |
| 5,731,544 | A | * | 3/1998 | Burck | H02G 3/14 220/241 |
| 5,796,040 | A | * | 8/1998 | Feketitsch | H02G 3/0633 174/650 |
| 5,914,159 | A | | 6/1999 | Kato | |
| 6,309,257 | B1 | | 10/2001 | Huang | |
| 6,361,336 | B1 | * | 3/2002 | Zhao | H01R 13/62938 439/157 |
| 7,017,764 | B2 | | 3/2006 | Okada | |
| 7,786,391 | B1 | * | 8/2010 | Van Pelt | H02G 3/18 277/606 |
| 9,153,950 | B2 | * | 10/2015 | Yamanaka | E04D 13/00 |
| 9,419,420 | B1 | * | 8/2016 | Parrish | H02G 3/0462 |
| 9,447,907 | B1 | | 9/2016 | Woodcock | H02G 9/04 |
| 9,742,169 | B1 | * | 8/2017 | Matsumura | H02G 3/081 |
| 10,483,735 | B1 | * | 11/2019 | Gretz | H02G 3/0481 |
| 10,765,950 | B1 | * | 9/2020 | Clementi | H01R 13/6658 |
| 10,847,958 | B1 | * | 11/2020 | Reed | H02G 3/0633 |
| 2002/0157848 | A1 | * | 10/2002 | Chiriku | B60R 16/0238 174/50 |
| 2002/0157852 | A1 | * | 10/2002 | Chiriku | H02G 3/18 174/60 |
| 2002/0168882 | A1 | * | 11/2002 | Chiriku | H01R 9/2466 439/76.2 |
| 2007/0218721 | A1 | * | 9/2007 | Naritomi | H05K 3/284 439/131 |
| 2009/0243524 | A1 | * | 10/2009 | Katayama | H02M 7/003 318/400.07 |
| 2010/0218797 | A1 | * | 9/2010 | Coyle, Jr | H02S 40/345 174/548 |
| 2010/0230127 | A1 | * | 9/2010 | Rodenberg | H02G 3/126 174/50 |
| 2010/0270071 | A1 | * | 10/2010 | Plankell | H02G 3/126 174/502 |
| 2010/0279529 | A1 | * | 11/2010 | Ng Vern Shen | H01R 13/5812 439/153 |
| 2011/0147171 | A1 | * | 6/2011 | Bhathija | H01H 71/025 361/643 |
| 2014/0069904 | A1 | * | 3/2014 | Sammons | H02G 15/113 219/136 |
| 2015/0138785 | A1 | * | 5/2015 | Oksengendler | H05K 5/0247 362/374 |
| 2016/0272073 | A1 | * | 9/2016 | Hosaka | H02M 7/44 |
| 2016/0315455 | A1 | * | 10/2016 | Kiyota | B60R 16/0238 |
| 2018/0006414 | A1 | * | 1/2018 | Ooishi | H02G 3/03 |
| 2018/0048132 | A1 | * | 2/2018 | Dinh | H02G 3/18 |
| 2018/0054050 | A1 | * | 2/2018 | Thomas | H02G 3/088 |
| 2018/0059348 | A1 | * | 3/2018 | Burkett | G02B 6/44465 |
| 2018/0310394 | A1 | * | 10/2018 | Kobayashi | H05K 1/0263 |
| 2020/0211926 | A1 | * | 7/2020 | Tahara | H05K 7/14322 |
| 2020/0389003 | A1 | * | 12/2020 | Kobayashi | H02G 3/22 |
| 2021/0408774 | A1 | * | 12/2021 | Hellige | H02G 3/085 |

FOREIGN PATENT DOCUMENTS

| | | |
|---|---|---|
| DE | 9305711 U1 | 6/1993 |
| DE | 4405408 C1 | 5/1995 |
| DE | 19755765 A1 | 6/1999 |
| DE | 20015259 U1 | 1/2001 |
| DE | 19700386 C2 | 10/2003 |
| DE | 10318414 A1 | 11/2003 |

* cited by examiner

HOUSING WITH A HOUSING PART COMPRISING AN INTEGRATED PROTECTIVE SECTION

CROSS-REFERENCE TO RELATED PATENT APPLICATION

This application is a continuation of international application number PCT/EP2021/057831 filed on Mar. 25, 2021, and claims the benefit of German application No. 10 2020 109 898.7 filed on Apr. 8, 2020.

This patent application relates to the subject matter disclosed in and claims the benefit of international application PCT/EP2021/057831, filed Mar. 25, 2021, and German application No. 10 2020 109 898.7, filed Apr. 8, 2020, the teachings and disclosure of which are hereby incorporated in their entirety by reference thereto for all purposes.

BACKGROUND OF THE INVENTION

The invention relates to a housing, in particular for an electrotechnical apparatus, the housing comprising at least two housing parts and the at least two housing parts each having a connecting face, said connecting faces, in a closed state of the housing, facing one another along a connecting section.

The invention additionally relates to an electrotechnical apparatus and to a motor vehicle component and to a motor vehicle, each in particular comprising a housing of the aforementioned kind.

In particular, an interior of the housing, which is surrounded at least in part by the at least two housing parts, is configured as a receptacle for electrical components of the electrotechnical apparatus. In particular, electrical components of the electrotechnical apparatus are arranged in the interior when in an assembled state. For example, at least one electrical component is a car battery and/or an electrical control device.

One object forming the basis of the invention is that of improving a housing and/or an electrotechnical apparatus and/or a motor vehicle component and/or a motor vehicle, in particular to improve the functionality thereof and/or to increase the operational safety thereof.

SUMMARY OF THE INVENTION

In some embodiments of the invention, the above-mentioned object is achieved by a housing which comprises at least two housing parts and the at least two housing parts each having a connecting face, said connecting faces, in a closed state of the housing, facing one another along a connecting section and at least one of the at least two housing parts has at least one integrated protective section.

For example, at least one integrated protective section serves for mechanical protection, in particular against fluids, preferably against water and/or cleaning liquids, in particular from a high-pressure cleaner, and/or against small solid particles, in particular dust particles, abrasive particles and/or dirt particles.

In particular, at least one integrated protective section is configured for electromagnetic compatibility (EMC) shielding. Preferably, this integrated protective section reduces the propagation of electromagnetic waves from the interior of the housing to the outside and/or from the outside into the interior, and, in particular, such propagation is at least approximately prevented by the protective section. In particular, in at least one protective section, the configuration for EMC protection is possible alternatively or additionally to the configuration as mechanical protection.

In particular, one of the advantages of embodiments of the invention is thus considered to lie in the fact that the interior of the housing is better protected by the integrated protective section, in particular from external foreign influences, for example from external material solid and/or liquid contaminants and/or electromagnetic influences, and in particular electrical components arranged in the housing interior are also protected.

Preferably, interference originating from electrical components arranged in the interior of the housing and affecting the area surrounding the housing, for example further parts of the electronic apparatus or of the motor vehicle, is also at least reduced or even at least approximately prevented by at least one protective section configured in particular as an EMC shielding section.

In particular, the protective section configured for EMC shielding is configured to hinder the propagation of electromagnetic waves and thus increases the electromagnetic compatibility (EMC) of the housing with, in particular, electrical components arranged therein. Preferably, the protective section is configured here in such a way that it fulfils at least one, in particular several, for example all requirements of corresponding standards and/or legal regulations in respect of electromagnetic compatibility.

For example, one advantage of embodiments of the invention is considered to lie in the fact that at least one of the housing parts has at least one integrated protective section, and in particular the integration of the protective section on the housing part simplifies an assembly of the latter, and therefore, for example, the housing can be produced more cost-effectively.

In some advantageous embodiments, it is provided that exactly one protective section is provided along the connecting section. For example, this allows the corresponding housing part to be produced simply and thus cost-effectively.

In other particularly favourable embodiments, it is provided that exactly two protective sections are provided along the connecting section, whereby, for example, these protective sections can be configured in a correspondingly specialised manner for a particular requirement each, in particular on the one hand for mechanical protection and on the other hand for EMC shielding, and thus preferably a protective effect can be increased.

In some advantageous embodiments with a plurality of protective sections along the connecting section, both of the at least two housing parts each have at least one integrated protective section.

In other particularly advantageous embodiments, it is provided that in the case of a plurality of protective sections provided, only one of the at least two housing parts has the plurality of protective sections, whereby in particular the production of the other of the two housing parts is simpler and thus more cost-effective.

With regard to the configuration of the at least one protective section and/or the plurality of protective sections, no further details have yet been provided.

In particular, one or the exactly one protective section and/or a plurality, for example all, of the plurality of, in particular the exactly two, protective sections have one or more of the features explained below. Thus, when a feature is explained below in conjunction with at least one protective section, this formulation is to be understood in such a way that the exactly one protective section and/or one, preferably a plurality, for example all, of the plurality of, in particular the exactly two, protective sections have this explained feature.

It is particularly favourable if at least one protective section is arranged captively on one of the housing parts. In particular, this means that the at least one protective section is fixedly connected to one of the housing parts and is integrated into same, and preferably that assembly is thus simplified and less prone to errors, since fewer individual components requiring assembly are provided.

In particularly advantageous embodiments, it is provided that a section of the one housing part forms at least one protective section. In particular, no separate component is thus required for the at least one protective section, so that in particular production costs can be reduced and preferably the assembly of the housing can be simplified.

It is particularly favourable if at least one protective section is a transformed section of the one housing part, thereby allowing simple production and formation thereof.

For example, at least one protective section, in particular the at least one transformed protective section, is pressed or stamped into the one housing part.

In some preferred embodiments, it is provided that at least one protective section is a section integrally formed on the one housing part.

For example, the integrally formed section is formed from a different material than the housing part. In other advantageous embodiments, the integrally formed section is made of the same material as the one housing part.

In particular, it is possible in the case of the integrally formed section to form it in accordance with special requirements and preferably to connect it fixedly to the one housing part, so that in particular by means of the integrally formed section an integrated protective section which can be formed flexibly and can be connected well to the housing part can be produced in a favourable manner.

In particularly advantageous embodiments, it is provided that a protective element associated with a housing part forms at least one protective section. In particular, if the protective element is a prefabricated element different from the housing part, these two can be conceived and manufactured in accordance with their requirements and, in particular, due to their integration, for example as explained below, the one housing part can be provided with an integrated protective section prior to the assembly of the housing, and said assembly can be performed simply and in a manner less prone to errors.

In particular, the protective element is fixed to the associated housing part, in particular already prior to assembly.

It is particularly advantageous if the protective element is connected to the associated housing part with a substance-to-substance bond, in a positively-locking manner and/or in a force-locking manner.

In particular, the protective element is arranged with a retaining section, in particular along the connecting section at least partially, preferably continuously, on the associated housing part, in particular captively.

In particular, the protective element, in particular a retaining section thereof, is connected to the one housing part by means of clinching.

In particularly advantageous embodiments, it is provided that the protective element is connected to the one housing part by a substance-to-substance bond, for example by welding.

In different embodiments, the protective element is produced from different materials.

In particularly favourable embodiments, it is provided that the protective element is formed from a metal material. For example, this allows it to be produced favourably and stably. The conductivity of the metal material preferably increases the EMC shielding.

For example, the metal material comprises steel, in particular carbon steel or spring steel.

In some favourable embodiments, the metal material comprises aluminium and/or copper and/or beryllium.

For example, the metal material is an alloy, in particular comprising copper and/or beryllium and/or aluminium.

Preferably, the protective element is coated, for example with a metal coating, in particular one comprising nickel and/or copper.

In some advantageous embodiments, the protective element is made of, in particular, nickel- or copper-plated steel, for example spring steel or cold-rolled strip.

Preferably, the protective element is produced from a flat material. It is particularly favourable if the protective element is a metal layer, for example made of sheet metal. Preferably, the protective element is formed as a ring which frames a housing part opening of the oppositely arranged housing part in a closed manner circumferentially.

For example, such an embodiment can be produced favourably and can be integrated in a space-saving manner, so that a protective section with a good protective function can thus be realised cost-effectively and also with, at most, a small free installation space.

It is particularly advantageous if at least one protective section is a transformed section of the protective element, in particular of the, for example, metal layer. In particular, this makes it possible to realise a structurally simpler protective section that can be produced cost-effectively.

It is particularly favourable if at least one protective section is flat.

In particular, at least one flat protective section has a contacting face with which the oppositely arranged housing part is contacted at least in the closed state. In particular, the contacting face allows good contact, preferably over the entire surface, with the opposite housing part, which in particular improves EMC shielding.

Alternatively or additionally, it is favourable if at least one protective section is formed flat to cover a gap between the connecting faces in the closed state of the housing, whereby the gap is covered along the protective section and mechanical protection against external influences is improved.

In some favourable embodiments, it is provided that at least one protective section has an edge. In particular, the edge has a spike-like cross-section transverse to a longitudinal extent of the protective section, the longitudinal extent being directed in particular along the connection contour. The edge favourably protrudes beyond a connecting side of the housing part that has this protective section. It is particularly advantageous if the edge is configured to extend toward the opposite housing part, in particular up to an edge tip, in particular starting from the housing part or starting from the protective element. Preferably, the edge contacts the opposite housing part, for example with its edge tip, and is in particular pressed onto the opposite housing part. This allows, for example, good contact between the housing parts or the opposite housing part and the protective element. In some embodiments, a fixed connection between the housing parts, for example, is also realised by means of the edge.

In some advantageous embodiments, at least one protective section is formed by a bead. For example, the bead is a half bead or a full bead. The configuration of the beads allows for a wide range of possibilities, whereby the protective section can be configured in a structurally simple manner in accordance with specific requirements.

In some favourable embodiments, the bead along the connecting section has substantially the same shape and/or dimensions.

In some particularly advantageous embodiments, the shape and/or dimensions of the bead vary along the connecting section. For example, the height of the bead varies along the connecting section, preferably being shorter at fastening points and/or points where loading occurs than between these points, which in particular makes contact with the opposite housing part more uniform and improved. In particular, the bead height is measured as the spacing between mutually averted sides of a bead top and a bead foot in the case of a full bead and between mutually averted sides of adjacent bead feet in the case of a half bead. In particular, the bead is arranged with two bead feet on spaced-apart sections, and in the case of a full bead the projecting bead top is arranged between the two bead feet and in the case of a half bead the two bead feet are arranged offset transversely to the bead course and projecting away from each other.

For example, the bead forming the at least one protective section is formed in one of the housing parts. In advantageous embodiments, the bead forming the at least one protective section is provided in the protective element, which is in particular formed as a metal layer.

In particularly favourable embodiments, at least one protective section is spring-mounted. In particular, this improves contacting of the oppositely arranged housing part, since tolerances of the other housing part can be compensated for by the spring-mounted configuration.

For example, at least one protective section is resiliently connected to the rest of the housing part or protective element forming this protective section.

Preferably, the at least one resiliently connected protective section is resiliently connected to a section of the housing part forming this protective section, said section of the housing part forming the connecting face. Alternatively or additionally, it is provided, for example, that this protective section is resiliently connected to a cover section which covers a housing part opening of the oppositely arranged housing part in the closed state.

When the resiliently connected protective section is formed by the protective element, it is particularly favourable if this protective section is resiliently connected to the retaining section of the protective element.

With regard to the further arrangement of the at least one protective section, in particular with regard to the arrangement with respect to the opposite housing part, no further details have yet been provided.

It is particularly favourable if at least one protective section in the closed state of the housing contacts the oppositely arranged of the at least two housing parts along the connecting section at least partially, preferably at least approximately continuously. This is particularly favourable for EMC shielding, since an at least partially continuous connection between the housing parts is hereby established and the propagation of the electromagnetic waves is thereby preferably at least reduced. The at least partial contact can also be favourable for mechanical protection, since the gap is at least substantially closed at these points, for example, and thus contaminants in particular cannot enter the gap.

In particular, at least one protective section establishes a metallic and/or galvanic contact between the at least two housing parts at least in sections, for example continuously, along the connecting section.

It is favourable if at least one protective section electrically conductively connects the at least two housing parts along the connecting section at least in sections, for example continuously.

In particularly advantageous embodiments, it is provided that at least one protective section, in the closed state of the housing, at least partially abuts the connecting face of the oppositely arranged housing part. In particular, this offers a structurally simple solution and assembly is simplified because the connecting face already faces the housing part with the protective section. In particular, the connecting face is a reworked face and thus has low tolerances, so that contacting is improved.

In some advantageous embodiments, it is provided that at least one protective section in the closed state of the housing at least partially abuts a wall section face of the oppositely arranged housing part, said wall section face extending away from the connecting face. For example, this is favourable in the case of housing parts with thin outer walls, in which little installation space is available at the connecting face, so that this little installation space can be used in particular for a sealing element and/or a further protective section. Abutment against the wall section face is also favourable in particular, so that the gap is continuously covered and thus particularly well protected from external influences.

In some advantageous embodiments, it is provided that at least one protective section along the connecting section is at least partially spaced from the oppositely arranged housing part. This is particularly favourable for an outside protective section, in which case there is still a free space between this protective section and a sealing element arranged in the gap between the connecting faces, it being possible for dirt and/or moisture to collect in this free space and to escape again from the gap due to the clearance provided by the spacing.

In particular, it is favourable if the protective section spaced-apart from the oppositely arranged housing part is spaced from an outer wall section face thereof and, in particular, has an end region which, viewed from the outside, is arranged at least partially in front of the wall section face but spaced therefrom. For example, the protective section is formed here as a collar covering the gap. In particular, this protective section extends from this wall region in the direction of the other housing part on which it is integrated, in particular as explained above, so that this protective section preferably covers the gap between the connecting faces on the outside, in particular for mechanical protection, and is arranged partially overlapping but in particular spaced from the wall section face.

In some advantageous embodiments, the configuration, in particular a shape and/or dimensions, of at least one protective section along the connecting section is substantially the same. In particular, this offers a structurally simple and cost-effective solution.

In some preferred embodiments, the configuration, for example a shape and/or dimensions, of at least one protective section varies along the connecting section, so that preferably the protective effect thereof can be optimised. For example, a height of the protective section measured transversely to the connecting faces varies. In particular, it is greater between points where loading occurs than at these loading points. Preferably, this improves continuous contacting.

In preferred embodiments, at least one protective section is configured to extend continuously along the connecting section. For example, a good and continuous protective effect can be achieved in this way.

In some particularly advantageous embodiments, it is provided that at least one protective section has one or more recesses along the connecting section. This is particularly favourable in order to allow contaminants and/or moisture to pass out of the recess behind the protective section, for example between the latter and a sealing element. Therefore, it is particularly favourable to make the recesses small in order to keep interruption of the protection small, but large enough to allow moisture and/or liquid to escape, although in particular a capillary action at the recess and/or along the protective section should be avoided.

In particular, it is favourable to provide the recesses in the case of a protective section arranged on the outside.

Preferably, one or more recesses are formed in an angled manner, so that in particular this recess does not run directly transversely to the longitudinal extent of the protective section and thus also in the region of the recess there is substantially no interruption of the protection by the protective section.

It is particularly advantageous if the protective section has two partial sections in the region of a recess, which run offset to each other transversely to the connection contour and in particular each run at least approximately parallel to the connection contour. Preferably, the recess runs in the region of the offset course between the two partial sections, so that in particular in this region the recess is delimited by the two partial sections in the direction transverse to the connection contour. In particular, the two partial sections each have, in the region of the recess, an end at which, in particular, the offset course of the two partial sections also ends. It is particularly advantageous here that the recess runs at an angle from the end of one of the partial sections on a transverse side of the protective section relative to the connection contour, at least approximately in the direction of the connection contour between the two partial sections, ultimately to the end of the other partial section on the opposite transverse side. Thus, in the case of such a particularly angled recess, an escape of liquid and/or moisture is favourably enabled, with continuous protection still being provided by the overlapping course of the partial sections, in particular protection for the inwardly arranged sealing element against damaging influences directly acting from the outside, such as impinging cleaning liquid from a high-pressure cleaner.

Preferably, a longitudinal extent of the one or more recesses, in particular along the connection contour, is at most 10 mm, in particular at most 5 mm, for example at most 2 mm long and/or at least 0.1 mm, for example at least 0.5 mm, in particular at least 1 mm long. For example, the longitudinal extent of the recesses is substantially smaller, for example at least five times, in particular at least ten times, smaller than a longitudinal extent of a section of the protective section adjoining the recess. For example, the recesses can be arranged at irregular spacings from one another, and in other advantageous embodiments the recesses are arranged at regular spacings from one another.

In particular, the recesses are suitably configured for EMC shielding, for example their spacing is equal to or an integer multiple of a wavelength of an electromagnetic wave to be shielded.

It is particularly advantageous if at least one protective section is arranged on the inside along the connecting section. In particular, the protective section arranged on the inside is arranged between a sealing element, arranged in the gap between the connecting faces, and the interior. In particular, an installation space present on the inside is also favourably utilised by the protective section, wherein, for example, a region of the in particular lid-like housing part adjacent to the connecting face can also be used for the formation and/or arrangement of the protective section on the inside, in particular for the forming, for example the stamping, of the protective section or for the connection thereof to the housing part by means of the retaining section.

In particular, the protective section provided on the inside at least partially contacts the housing part arranged opposite.

Preferably, the connecting section arranged on the inside is arranged on an inside edge section of the outer wall at which, in particular, the connecting face and a wall section face of the outer wall of one of the housing parts meet, for example for a connection forming the integration or for contacting the oppositely arranged housing part having the edge section.

In particular, the protective section contacts an edge section, especially an edge thereof, of the outer wall of the oppositely arranged housing part.

In particularly preferred embodiments, it is provided that at least one protective section is arranged on the outside along the connecting section. In particular, this is favourable so that contaminants are already prevented from entering at the outside and, for example, a sealing element arranged in the gap is also protected. In particular, the protective section provided on the outside is connected to one of the housing parts on the outside for integration thereon. In particular, the protective section provided on the outside contacts the oppositely arranged housing part on the outside, for example at an edge section and/or at an outer wall section face. In some advantageous embodiments, the protective section arranged on the outside is spaced from the oppositely arranged housing part.

For example, the protective section arranged on the outside is arranged, for example connected or arranged in a contacting manner, at an outside edge section at which, in particular, the connecting face and an outer wall section face of the corresponding housing part meet.

In some advantageous embodiments, the protective section arranged on the outside is arranged in a contacting or spaced-apart manner in relation to an outside wall section face.

It is particularly advantageous if a protective portion at least partially covers the gap between the at least two housing parts along the connecting section. This offers, in particular, favourable protection against contaminants and/or for EMC shielding, since the area exposed by the gap is covered by the protective section. For example, the protective section is configured to cover the outside, whereby dirt in particular is already kept out at the outside. In some favourable embodiments, the protective section is configured to cover the inside, for example for EMC shielding or to protect the gap and/or interior on the inside.

In particular, the protective section covers the gap transversely to its height extent, which runs between the limiting connecting faces. In particular, it is provided that the protective section extends at least between the geometric connection planes in which the connecting faces run and preferably at least on one side, preferably on both sides, i.e. projects beyond one or both of these geometric connection planes.

In some particularly advantageous embodiments, it is provided that the at least two housing parts terminate flush on the outside, in particular in the region of the connecting section. In particular, this is favourable so that no disturbing projections occur at the transition of the housing parts and/or for a space-saving configuration of the connecting section.

For example, a protective section is arranged on the outside and terminates flush with the oppositely arranged housing part. In particular, an outer wall section face and an outer face of the protective section transition flush into one another on the outside. In particular, the outside protective section is provided in particular in a contacting manner at an outside edge section.

It is particularly favourable if at least one protective section abuts the oppositely arranged housing part under force. In particular, a spring-mounted protective section is in abutment under force. In particular, the force application allows a particularly favourable contacting and an abutment that compensates for the tolerances of the oppositely arranged housing part.

In some advantageous embodiments, it is provided that at least along the connecting section at least one protective section at least partially adapts to the oppositely arranged housing part by plastic deformation. In particular, this achieves good contacting and/or connection between the housing parts and thus a good protective effect.

No further details have yet been given regarding other elements.

It is particularly advantageous if, at least in the closed state, a sealing element is arranged between the two connecting faces of the at least two housing parts. In particular, the sealing element acts in a media-sealing manner, thus in particular against liquid and/or gaseous fluids and for example also against small particles. In particular, the interior is hereby sealed by the sealing element. Preferably, the sealing element runs continuously along the connecting section and in particular at least substantially along the connection contour.

In particular, the sealing element is a separate part from the one protection section or plurality of protective sections, so that these can each be devised separately for their respective functions.

The sealing element can be formed from a wide variety of sealing materials.

For example, the sealing element is a metal sealing element.

In other advantageous embodiments, the sealing element is made of a material comprising polymers.

In particularly advantageous embodiments, it is provided that the sealing element is at least partially made of elastomer and is preferably an elastomer sealing element. For example, the sealing element is arranged as an elastomer sealing bead between the connecting faces.

For example, in some embodiments, the sealing element is placed between the connecting faces during the assembly process.

In particularly advantageous embodiments, it is provided that the sealing element is fixedly arranged on one of the housing parts, in particular on a housing part with a protective section, in particular is already fixedly arranged before the housing is assembled. In particular, this facilitates assembly and already offers a good sealing effect between the sealing element and the one housing part.

In particular, the sealing element material is connected to at least one housing part in a force-locking and/or positively-locking manner.

For example, the sealing element itself is formed from an adhesive material and is thus fixedly connected to the one housing part self-adhesively. In other advantageous embodiments, the sealing element is fixedly connected to the one housing part by means of an adhesive substance.

It is particularly advantageous if at least one protective section, in particular for EMC shielding and/or for mechanical protection, is arranged on the inside relative to the sealing element, the inside protective section thus being arranged between the sealing element and the interior. Alternatively or additionally, it is particularly preferred if at least one protective section is arranged on the outside relative to the sealing element, the sealing element being arranged in particular between the outside protective section and the interior.

Particularly preferred embodiments comprise an outside protective section, for example in the form of an embossed edge or in the form of a collar, in particular with recesses, the outside protective section favourably serving as mechanical protection for the sealing element, and an inside protective section for EMC shielding, which in particular at least approximately continuously contacts the opposite housing part, as well as a sealing element which is arranged between the two protective sections.

It is particularly advantageous, in embodiments with a protective element, if the retaining section and the sealing element are arranged together on one of the housing parts, so that the same housing part is connected to the retaining section and the sealing element. For example, this simplifies construction and assembly of the housing parts, since only one of the housing parts needs to be devised for connection to the sealing element and the protective element.

No further details have yet been given regarding other configurations of the housing and its housing parts.

It is particularly advantageous if the at least two housing parts are pressed against one another. For example, this allows a stable connection between them and, in particular, the sealing element is acted upon by the pressure and its sealing effect is preferably increased.

In particular, the at least two housing parts are pressed axially against each other. In particular, the axial pressing takes place at least approximately perpendicularly to a geometric plane in which one of the at least two housing parts, which is in particular lid-like, substantially extends, an extent of the latter perpendicularly to the geometric plane being in particular substantially smaller, for example at least five times, preferably at least ten times, smaller than its maximum extent in the geometric plane. It is particularly advantageous if the axial pressing is performed transversely, in particular at least approximately perpendicularly, to the connecting faces, in particular to geometric connection planes thereof. In particular, at least one outer wall of the at least two housing parts extends away from their connecting face at least approximately parallel to the axial pressing. Advantageously, assembly of the housing is simplified by the axial pressing, since in particular the housing parts only have to be substantially placed on top of each other and pressed.

In particular, it is provided that at least substantially no radial pressing is provided between the at least two housing parts. In particular, a direction of the radial pressing runs at least approximately perpendicularly to a direction of the axial pressing. In particular, a wall section face extending away from the connecting face is or would be acted upon in the case of radial pressing. The absence of such a radial pressing simplifies in particular the assembly, and in particular distortions and/or creases in the housing parts are avoided.

In particular, fastening means are provided which connect the two housing parts to each other at fastening points. In particular, the fastening points are provided on the outside of the connection contour in relation to the interior, so that the possibility of leakage into the interior is at least reduced or even completely prevented, particularly at these points.

For example, flange projections are provided at the fastening points on the one, in particular lid-like, housing part and, for example, on the other of the at least two housing parts, its outer wall is reinforced, for example thicker, to accommodate the fastening means.

It is particularly favourable if at least one protective section, for example at least on the outside, runs along the fastening points, and thus in particular the fastening points are also provided with appropriate protection.

Preferably, the housing parts are acted upon by the fastening means.

In particularly favourable embodiments, deformation limiters are arranged in the region of the fastening means. In particular, the deformation limiters limit an application of force by the fastening means and/or a deformation of the housing parts by the application of force and are configured to be correspondingly stable for this purpose.

For example, the deformation limiters are transformed sections of one of the housing parts.

It is particularly favourable if at least one protective section transitions into at least one deformation limiter. For example, at least one protective section in the region of at least one fastening point forms the deformation limiter, in particular with one or more of the explained features.

Alternatively or in addition, the above-mentioned object is achieved by an electrotechnical apparatus which has a housing of the kind mentioned at the outset with at least one, preferably a plurality, of the features explained above, the advantages of these features being transformed to the electrotechnical apparatus.

In particular, it is provided that at least one electrical component of the electrotechnical apparatus is arranged in the interior of the housing and, in particular, this and/or a surrounding area thereof is protected by the at least one integrated protective section as explained above.

Furthermore, the object mentioned at the outset is alternatively or additionally achieved by a motor vehicle component which has a housing and/or an electrotechnical apparatus with at least one, preferably a plurality, of the features explained above, the advantages described above being transformed to the motor vehicle component. In particular, in the case of the motor vehicle component, electromagnetic compatibility is important for an electrical component arranged in the interior of the housing and for the area surrounding the housing. In addition, the motor vehicle component in particular also requires mechanical protection, in order to keep dirt particles, for example created during operation of a motor vehicle, and/or fluids that act on the motor vehicle, for example weather-related liquids and/or cleaning liquids occurring during cleaning, for example by means of a high-pressure cleaner, in particular out of the interior of the housing.

Furthermore, the object mentioned at the outset is alternatively or additionally achieved by a motor vehicle which has a housing and/or an electrotechnical apparatus and/or a motor vehicle component with at least one, preferably a plurality, of the features explained above, the advantages described above being transformed to the motor vehicle accordingly.

Above and below, the wording is to be understood, at least approximately, in conjunction with a statement as meaning that technically conditional and/or technically irrelevant deviations are included in the statement, in particular that deviations of up to 20%, in particular up to 10%, for example of up to 5%, are included. In the case of directional indications, deviations of up to 20°, in particular up to 10°, for example up to 5°, are included.

The expressions "in particular", "preferably", "for example" and the like are to be understood to mean that the features mentioned in conjunction with these expressions are optionally but not necessarily provided in solutions in accordance with the invention.

The above description of solutions in accordance with the invention thus comprises in particular the various combinations of features defined by the following consecutively numbered embodiments:

1. A housing (100), in particular for an electrotechnical apparatus, comprising at least two housing parts (112, 114) which each have a connecting face (126, 156), said connecting faces, in a closed state of the housing (100), facing one another along a connecting section (196), wherein at least one of the at least two housing parts (112, 114), along the connecting section (196), has at least one integrated protective section (212, 232), in particular for EMC shielding and/or for mechanical protection.

2. A housing (100) in accordance with embodiment 1, wherein exactly one protective section (212, 232) is provided along the connecting section (196) or exactly two protective sections (212, 232) are provided.

3. A housing (100) in accordance with the preceding embodiments, wherein at least one protective section (212, 232) is arranged captively on one of the housing parts (112, 114).

4. A housing (100) in accordance with the preceding embodiments, wherein a section of the one housing part (112, 114) forms at least one protective section (212, 232).

5. A housing (100) in accordance with the preceding embodiments, wherein at least one protective section (212, 232) is a transformed section of the one housing part (112, 114).

6. A housing (100) in accordance with the preceding embodiments, wherein at least one protective section (212, 232) is pressed or stamped into the one housing part (112, 114).

7. A housing (100) in accordance with the preceding embodiments, wherein at least one protective section (212, 232) is a section integrally formed on the one housing part (112, 114).

8. A housing (100) in accordance with the preceding embodiments, wherein at least one protective section (212, 232) is formed by a protective element (352) associated with one housing part (112, 114), in particular the protective element (352) being connected to the one housing part (112, 114) by an arrangement section (354).

9. A housing (100) in accordance with the preceding embodiment, wherein the protective element (352) is connected to the one housing part (112, 114) by clinching and/or by a substance-to-substance bond, in particular welding.

10. A housing (100) in accordance with the two preceding embodiments, wherein the protective element (352) is formed from a metal material, in particular is a metal layer.

11. A housing (100) in accordance with the three preceding embodiments, wherein at least one protective section (212, 232) is a transformed section of the protective element (352), in particular of the metal layer.

12. A housing (100) in accordance with the preceding embodiments, wherein at least one protective section (212, 232) is flat, in particular has a contacting face (216) or is formed flat to cover a gap between the connecting faces (126, 156) in the closed state of the housing (100).

13. A housing (100) in accordance with the preceding embodiments, wherein at least one protective section (212, 232) has an edge, in particular with a spike-like cross-section, which in particular protrudes beyond a connecting side (124, 154) of the housing part (112, 114) that has this protective section.

14. A housing (100) in accordance with the preceding embodiments, wherein at least one protective section (212, 232) is formed by a bead, in particular in one of the housing parts (112, 114) and/or in the protective element (352).

15. A housing (100) in accordance with the preceding embodiments, wherein at least one protective section (212, 232) is spring-mounted.

16. A housing (100) in accordance with the preceding embodiments, wherein at least one protective section (212, 232) is resiliently connected to a section (174) forming the connecting face (126, 156) and/or to the retaining section (354).

17. A housing (100) in accordance with the preceding embodiments, wherein at least one protective section (212, 232), in a closed state of the housing (100), contacts the oppositely arranged one of the at least two housing parts (112, 114) along the connecting section (196) at least partially, in particular at least approximately continuously.

18. A housing (100) in accordance with the preceding embodiments, wherein at least one protective section (212, 232), in the closed state of the housing (100), at least partially abuts the connecting face (126, 156) of the oppositely arranged housing part (112, 114).

19. A housing (100) in accordance with the two preceding embodiments, wherein at least one protective section (212, 232), in the closed state of the housing (100), at least partially abuts a wall section face (148, 149) of the oppositely arranged housing part (112, 114) extending away from the connecting face (126, 156).

20. A housing (100) in accordance with the preceding embodiments, wherein at least one protective section (212, 232) along the connecting section (196) is spaced at least partially, in particular continuously, from the oppositely arranged housing part (112, 114), in particular from an outer wall section face (149) thereof.

21. A housing (100) in accordance with the preceding embodiments, wherein at least one protective section (212, 232) along the connecting section (196) has one or more recesses (372), wherein the at least one protective section has two partial sections, in particular in the region of at least one recess (372), which run offset to each other transversely to the connection contour and the recess runs between the two partial sections in the region of the offset course.

22. A housing (100) in accordance with the preceding embodiments, wherein at least one protective section (212, 232) is arranged on the inside along the connecting section (196), in particular is arranged on an inside edge section (144) of an outer wall (122, 152) of the housing (100).

23. A housing (100) in accordance with the preceding embodiments, wherein at least one protective section (212, 232) is arranged on the outside along the connecting section (196), in particular at an outside edge section (146) and/or an outside wall section face (149) of an outer wall (122, 152) of the housing (100).

24. A housing (100) in accordance with the preceding embodiments, wherein at least partially along the connecting section (196) at least one protective section (212, 232) covers a gap (188) between the at least two housing parts (112, 114), in particular on the outside.

25. A housing (100) in accordance with the preceding embodiments, wherein the at least two housing parts (112, 114) terminate flush on the outside, in particular at least one protective section (212, 232) terminates flush with the opposite housing part.

26. A housing (100) in accordance with the preceding embodiments, wherein at least along the connecting section (196) at least one protective section (212, 232) abuts the oppositely arranged housing part (112, 114) under force.

27. A housing (100) in accordance with the preceding embodiments, wherein at least along the connecting section (196) at least one protective section (212, 232) at least partially adapts to the oppositely arranged housing part (112, 114) by plastic deformation.

28. A housing (100) in accordance with the preceding embodiments, wherein, at least in the closed state, a sealing element (182), in particular as a sealing bead, is arranged between the two connecting faces (126, 156) of the at least two housing parts (112, 114).

29. A housing (100) in accordance with the preceding embodiment, wherein the sealing element (182) is fixedly arranged on one of the housing parts (112, 114).

30. A housing (100) in accordance with the two preceding embodiments, wherein at least one protective section (212, 232) is arranged on the inside and/or outside relative to the sealing element (182).

31. A housing (100) in accordance with the three preceding embodiments, wherein the retaining section (354) and the sealing element (182) are arranged together on one of the housing parts (112, 114), in particular the retaining section (354) is held between the one housing part (112, 114) and the sealing element (182).

32. A housing (100) in accordance with the preceding embodiments, wherein the at least two housing parts (112, 114) are pressed against one another, in particular axially.

33. An electrotechnical apparatus, wherein this comprises a housing (100) in accordance with the preceding embodiments, in particular at least one electrical component of the electrotechnical apparatus being arranged in the interior (118) of the housing.

34. A motor vehicle component which comprises a housing (100) and/or an electrotechnical apparatus in accordance with the preceding embodiments.

35. A motor vehicle which comprises a housing (100) and/or an electrotechnical apparatus and/or a motor vehicle component in accordance with the preceding embodiments.

Further configurations and advantages of the invention are explained below by way of example in conjunction with several exemplary embodiments.

DETAILED DESCRIPTION OF THE INVENTION

Figure 1:
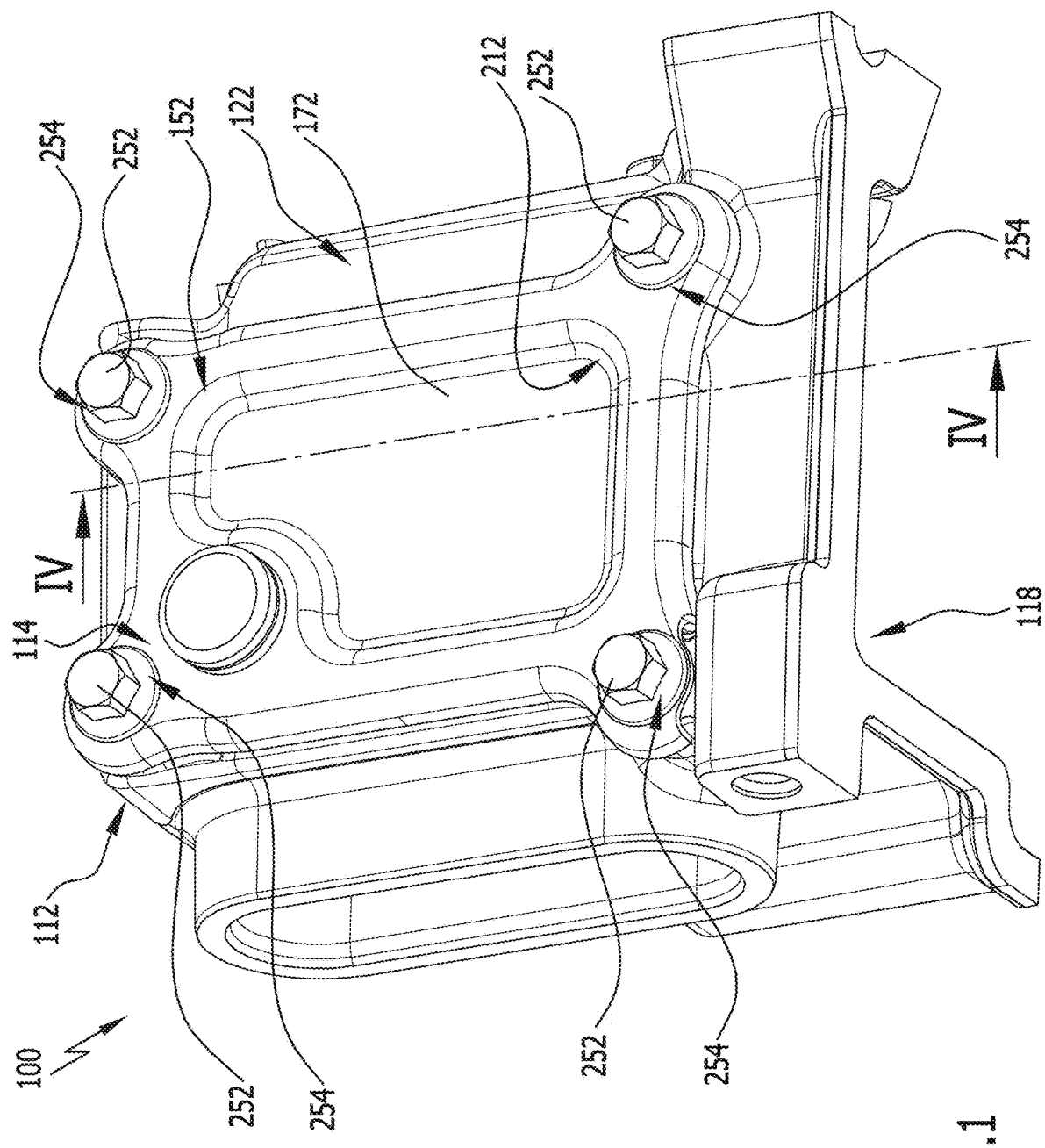
FIG. 1 shows a plan view of a first exemplary embodiment of a housing.
Figure 2:
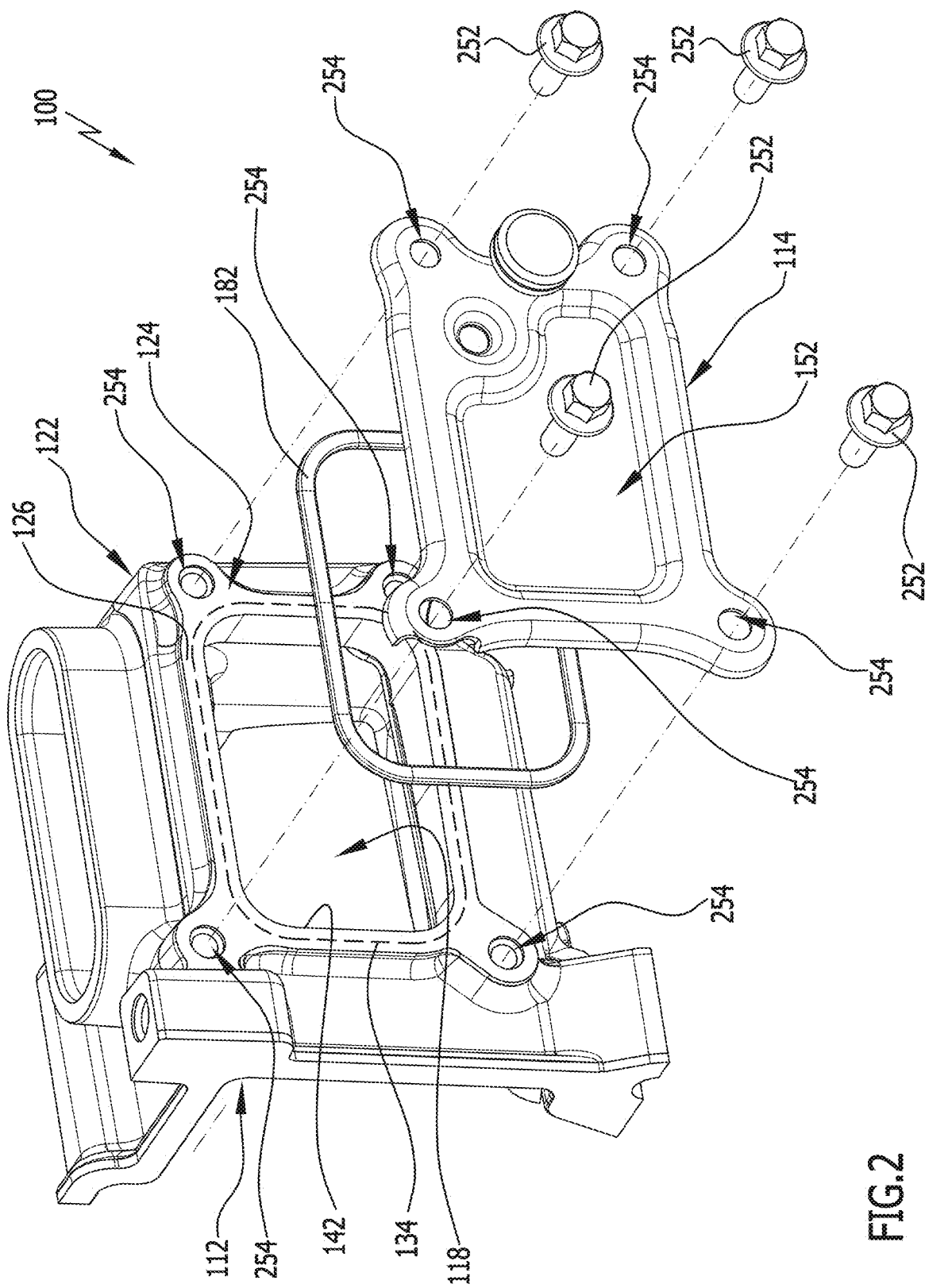
FIG. 2 shows an exploded depiction of the housing of the first exemplary embodiment.
Figure 3:
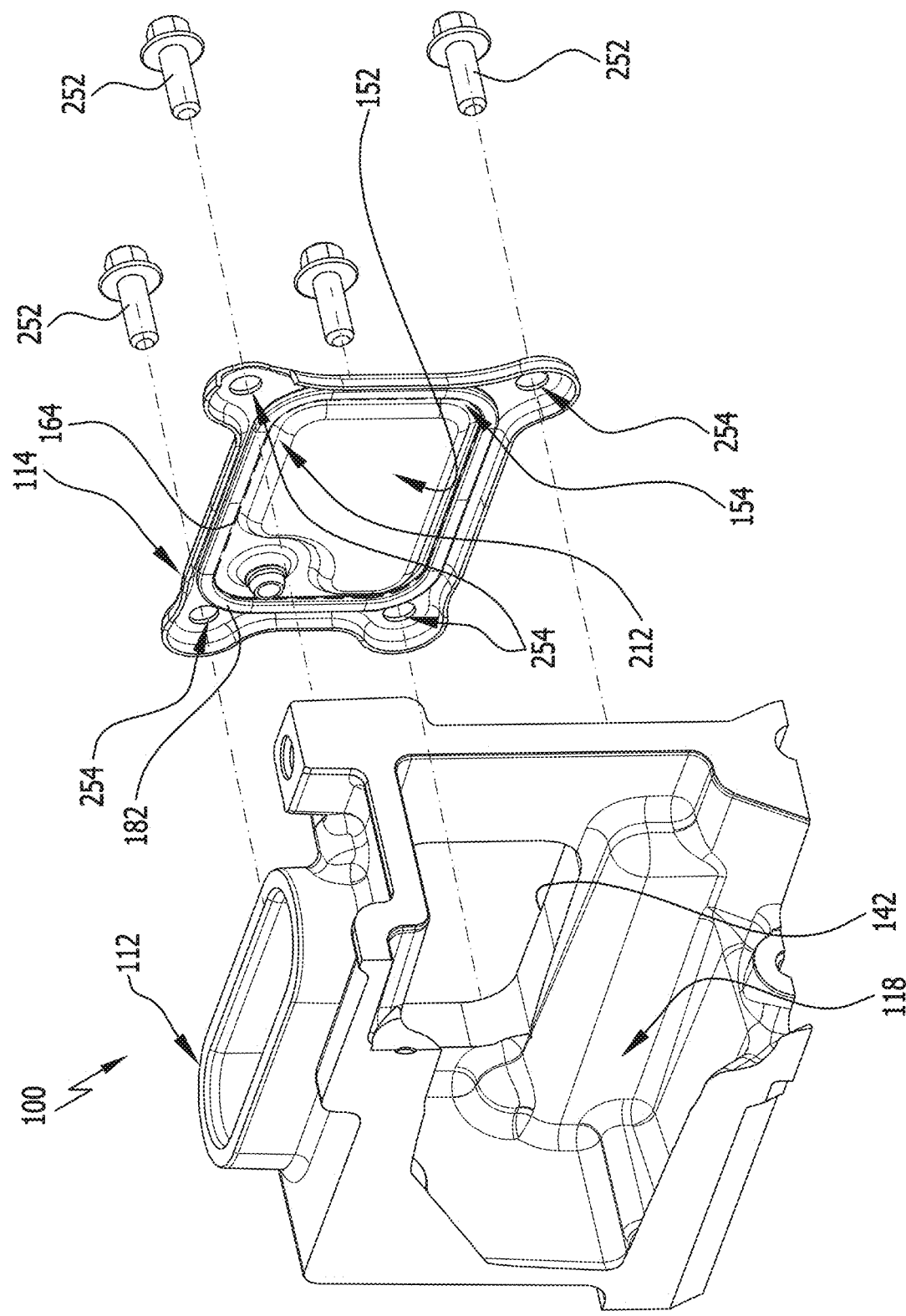
FIG. 3 shows a further exploded depiction of the housing of the first exemplary embodiment.
Figure 4:
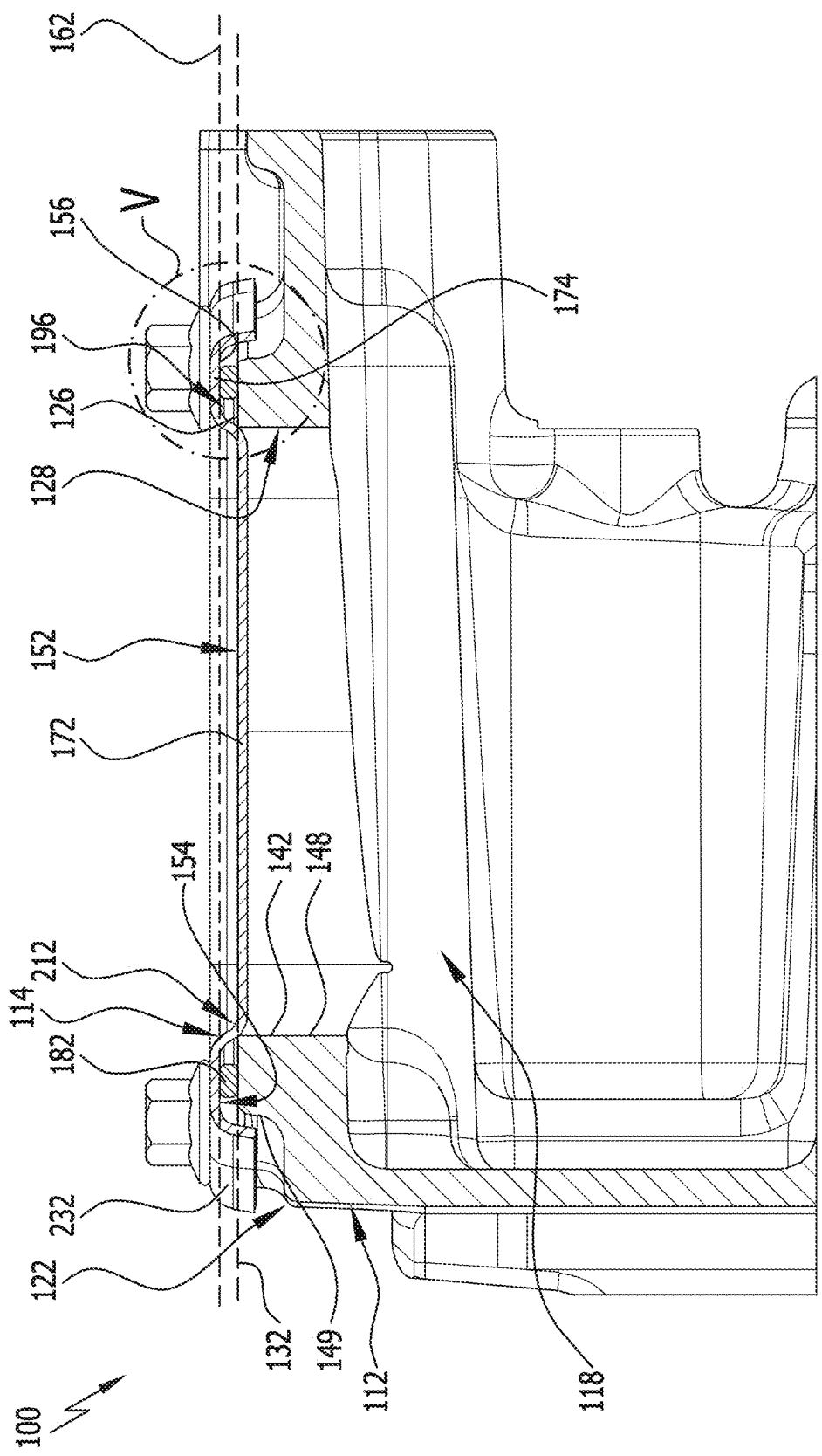
FIG. 4 shows a sectional depiction of the housing of the first exemplary embodiment in accordance with the section IV-IV as shown in FIG. 1.
Figure 5:
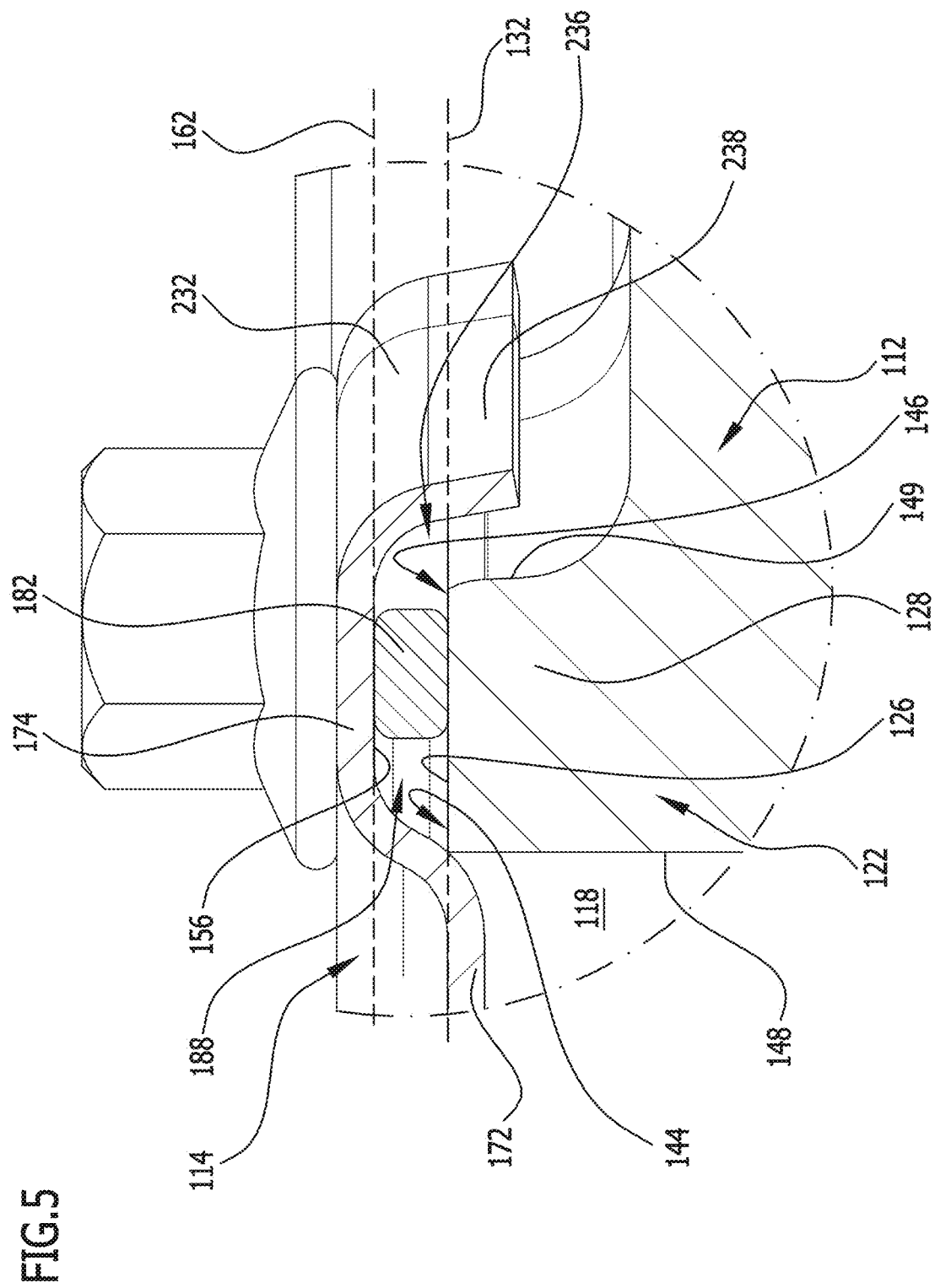
FIG. 5 shows a partial enlarged depiction of a region of a connecting section between two housing parts of the housing, said region being denoted by V in FIG. 4.
Figure 6:
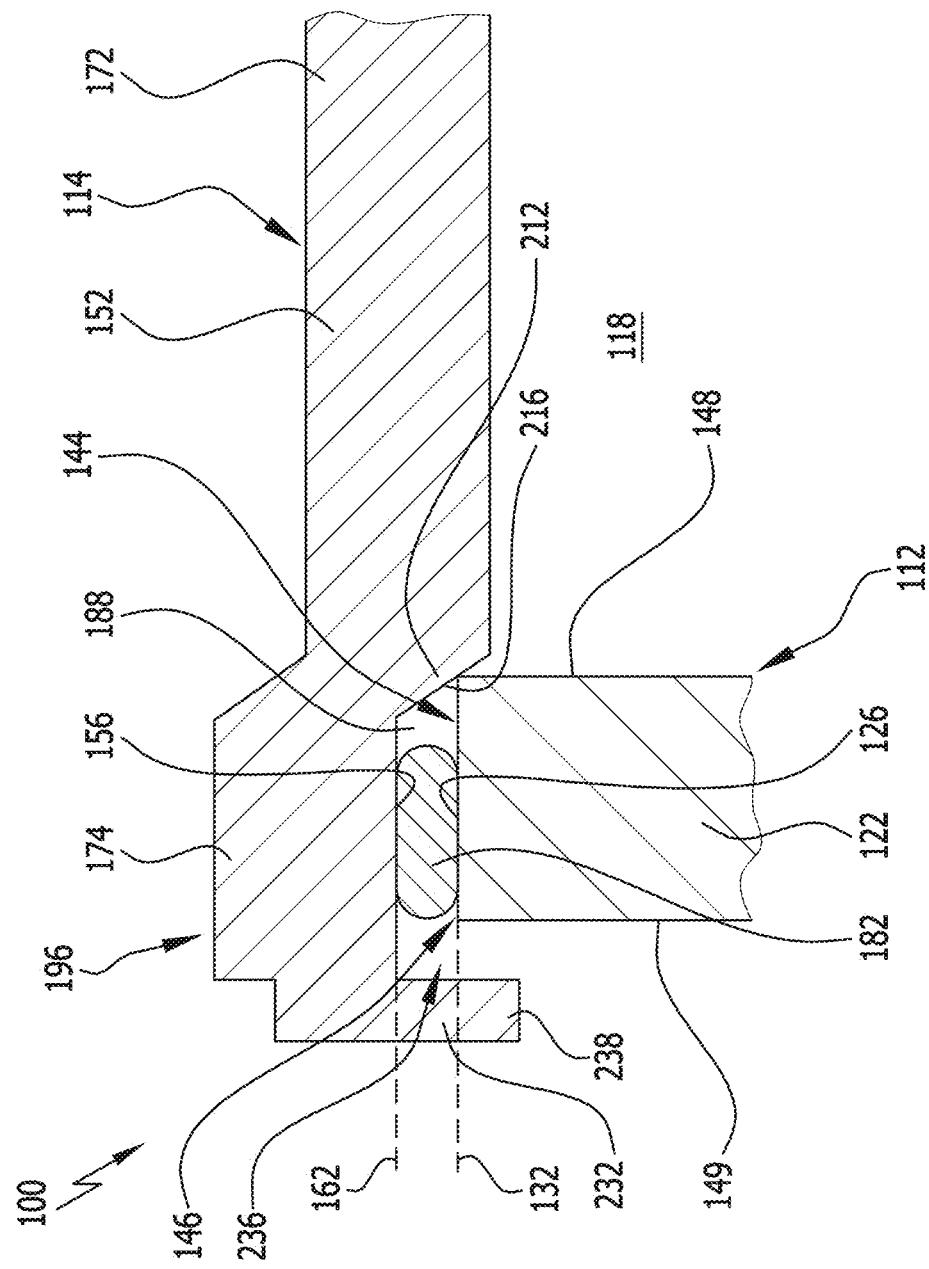
FIG. 6 shows a schematic sectional depiction of the connecting section of the first exemplary embodiment.

An electrotechnical apparatus comprises a housing denoted as a whole by 100, which is shown by way of example in FIGS. 1 to 6.

The housing 100 comprises a plurality of housing parts, at least two housing parts 112 and 114, which surround an interior 118 of the housing 100. In particular, the interior 118 is a receptacle for one or more electrical devices, for example comprising electrical circuits and in particular comprising a car battery, which are not shown graphically in the figures.

The housing part 112 comprises an outer wall 122 that at least partially surrounds the interior 118. For example, the outer wall 122 surrounds the interior 118 largely laterally with, for example, four side wall sections.

On a connecting side 124, the outer wall 122 has a connecting face 126.

The connecting face 126 faces the other housing part 114 and runs in particular in a geometric connection plane 132, up to which a part of the outer wall 122, for example a connecting collar 128 thereof, extends.

The connecting face 126 runs along a connection contour 134, which here runs in the connection plane 132 and in a closed manner around a housing part opening 142, so that the connecting face 126 frames the housing part opening 142.

The connecting face 126 extends transversely to the connection contour 134 between an inside edge section 144 and an outer edge section 146, the inside edge section 144 in particular delimiting the housing part opening 142, and the connecting face 126 and an inner wall section face 148, which at least partially delimits the interior 118, meeting at the inner edge section, for example in an edge-like manner. At the outer edge section 146, the connecting face 126 meets, for example in an edge-like manner, with an outer wall section face 149 running on an outer side facing away from the interior 118.

In particular, the inner and outer wall section faces 148, 149 extend obliquely, for example at least approximately perpendicularly, away from the geometric connection plane. For example, the connecting collar 128 provided extends between the inner and outer wall section faces 148 and 149 and is integrally formed on, but offset from, the remaining part of the outer wall 122, in particular the side wall sections, so that their inner and outer side wall section faces are offset from the inner and outer wall section faces 148 and 149. In variants, the inner and outer wall section faces 148, 149 transition into the inner and outer side wall section faces respectively without being offset.

For example, the outer wall 122 of the housing part 112 has further openings at which further housing parts can be arranged and/or through which parts of the electrotechnical apparatus, for example cables, can be passed and the electrotechnical apparatus can be connected to other functional elements by means of these parts and is connected in a connected state. In other variants of the exemplary embodiment, it is provided that the outer wall 122 substantially surrounds the interior 118 in a closed manner and has only the one housing part opening 142.

The other housing part 114 also has an outer wall 152, which, on a connecting side 154 thereof, has a connecting face 156 corresponding to the connecting face 126 of the housing part 112.

In particular, the connecting face 156 extends in a geometric connection plane 162 which, in an assembled state of the housing 100, runs at least approximately parallel to the geometric connection plane 132 of the housing part 112. In particular, the connecting face 156 also runs along a connection contour 164 which preferably has the same course as the connection contour 134 of the housing part 112.

The other housing part 114 is formed in particular in a lid-like manner, corresponding to the housing part opening 142 of the housing part 112, at least one lid section 172 of the outer wall 152 substantially covering the housing part opening 142 in the closed state of the housing 100, and a connecting part 174 of the outer wall 152 forming the connecting face 156 extending in a closed manner around the lid section 172.

In particular, the other housing part 114, which is formed, for example, in a lid-like manner, is formed as a substantially flat wall part which extends substantially in two mutually perpendicular directions of extent and has a considerably smaller extent in a direction of extent running perpendicular to the two first-mentioned directions of extent. The two directions of extent preferably run at least approximately parallel to the geometric connection plane 162.

In addition, a sealing element 182 is provided on the connecting faces 126, 156 along the connection contours 134, 164 and is arranged captively in particular on one of the housing parts 112, 114, in this case on the, in particular lid-like, housing part 114. For example, the sealing element 182 is fixedly connected to the housing part 112, 114 adhesively.

Preferably, the sealing element 182 is configured as an elastomer seal and is applied, for example, as a sealing bead to one of the housing parts 112, 114, in particular to its connecting face 126, 156.

The sealing element 182 is intended for sealing media between the two housing parts 112, 114 in the closed state and seals a gap 188 between the two connecting faces 126, 156 of the two housing parts 112, 114 media-tightly in the closed state and is thus configured in particular to seal against water, moisture and other liquids and, for example, against small solid particles, such as dirt, dust and/or abrasive particles.

Thus, in the closed state of the housing 100, in a connecting section 196, sections of the two housing parts 112, 114, which form the connecting faces 126, 156, run correspondingly to one another along the connection contours 134, 164, and the connecting faces 126, 156 of the latter face one another, and the gap 188 is formed therebetween and is closed at least approximately media-tightly by the sealing element 182. In particular, the connecting section 196 runs circumferentially in a closed manner around the housing part opening 142, which is covered by the cover section 172 in the closed state and is thus at least approximately closed media-tightly by the other housing part 114, in particular together with the sealing element 182.

The at least two housing parts 112, 114 are in particular formed from a metal material.

In particular, the housing part 112 is a cast part in which the connecting face 126 is reworked, for example over-milled, and thus has lower tolerances than the non-reworked wall section faces 148, 149.

The other housing part 114 is in particular made of a flat material, for example a sheet metal, and is preferably transformed into its final form.

For EMC shielding, one of the housing parts 112, 114, in this exemplary embodiment the, in particular lid-like, housing part 114, has a protective section formed as an integrated shielding section 212, which contacts the opposite housing part 112 along the connecting section 196 at least in sections and preferably completely along the connecting section 196. In this exemplary embodiment, the shielding section 212 is a transformed section of the housing part 114, in particular of its outer wall 152.

The shielding section 212 comprises a contacting face 216, which abuts opposite a housing part 112 and contacts the inside edge section 144, for example an edge thereof, in particular under application of a force.

The shielding section 212 runs slightly offset here on the interior side from the connection contour 164 and is arranged between the cover section 172 and the section of the outer wall 152 forming the connecting face 156 and connects these sections.

In particular, the shielding section 212 is integrally formed on the section with the connecting face 156 and extends obliquely with respect to the latter and the geometric connection plane 162, for example at an angle between 30° and 70°, away from the latter in the direction of the opposite housing part 112 and in particular to such an extent that, in the closed state of the housing 100, the shielding section 212 protrudes beyond the geometric connection plane 132 of the other connecting face 126 and engages, at least with a small section, in the housing part opening 142.

On a side of the shielding section 212 which is arranged opposite its side facing the section 174 with the connecting face 156, the shielding section 212 is in particular integrally formed on the cover section 172, and in the closed state in particular the cover section 172 runs at least approximately parallel to the geometric connecting face 132 and is arranged, for example, laterally of the connecting collar 128 at least partially in the housing part opening 142, and the shielding section 212 is integrally formed on the cover section 172 by the region of the shielding section that engages in the housing opening 142.

In this case, the contacting face 216 is arranged on the same side of the outer wall 152 as the connecting face 156 and an inner face of the cover section 172 facing the interior 118.

Preferably, the housing part 114 has a further protective section formed as a cover section 232, which at least partially covers the gap 188 along the connecting section 196 on an outer side 236 averted from the interior 118.

Preferably, the cover section 232 is formed as a transformed section of the, in particular lid-like, housing part 114.

In the closed state, the cover section 232 extends at least between the two geometric connection planes 132 and 162 and preferably projects beyond them on both sides. In particular, the cover section 232 is integrally formed on the section 174 with the connecting face 156 and extends away therefrom in the direction of the oppositely arranged housing part 112, wherein in particular an end region 238 of the protective section 232 is arranged overlapping on the outside with a section of the housing part 212, in particular of the connecting collar 128, in front of at least a part of the outer wall section face 149.

In some variants, the cover section 232, in particular with its end region 238, at least partially contacts the opposite housing part 112, for example at the outer wall section face 149 thereof, whereby in particular the EMC shielding is improved. In other variants, a small gap is provided in particular in the overlapping region between the cover section 232, in particular the end region 238 thereof, and the opposite housing part 112, in particular the outer wall section face 149, whereby larger tolerances on the cast housing part 112 can be better compensated and assembly of the housing parts 112, 114 is simplified and potential stresses are at least reduced.

The housing parts 112 and 114 are connected to each other by means of fastening means 252 at fastening points 254. In particular, the housing parts 112 and 114 are screwed together by means of screws as fastening means 252 at fastening points 254 having screw holes.

Preferably, the fastening points 254 are arranged relative to the interior 118 outwardly of the connection contours 134 and 164, and in this variant of the exemplary embodiment the fastening points 254 are arranged between the connection contours 134 and 164 on the one hand and the contour along which the cover section 232 runs on the other hand.

For example, the housing part 112, in particular at its connection collar 128, has wall thickenings, which are provided with screw holes.

The other, in particular lid-like, housing part 114 has, for example, flange projections at the fastening points 254, said flange projections being provided in particular with apertures for the fastening means 252. Preferably, the flange projections are provided outwardly with partial sections of the cover section 232.

In particular, by means of the fastening means 252, the two housing parts 112, 114 are pressed at least slightly against each other in the closed state, so that the sealing element 182 is compressed between them both, in particular between the two connecting faces 126 and 156, and thus has a sealing effect in the gap 188 in a particularly favourable manner.

In addition, the shielding section 212 is applied under force against the oppositely arranged housing part 112 so that, due to the application of force and a flexible inherent elasticity of the shielding section 212, the latter contacts the oppositely arranged housing part 114 at least approximately completely along the connecting section 196, even with large tolerances.

In a second to sixth exemplary embodiment, shown by way of example in FIGS. 7 to 11, a housing 100 comprises at least two housing parts 112, 114 which at least partially surround an interior 118 and have respective sections along a connecting section 196 which face each other in a closed state of the housing. For example, the housing 100 with the at least two housing parts 112, 114 is formed at least substantially as in the first exemplary embodiment and has one or more of the features explained in connection with the first exemplary embodiment, in particular with respect to the connecting faces 126, 156 and/or the outer walls 122, 152 and/or the geometric connection planes 132, 162 and/or the connecting collar 128 and/or the cover section 172. In particular, in these exemplary embodiments, a sealing element 182, for example with one or more of the features explained above in conjunction with the first exemplary embodiment, is also provided.

Elements that are of at least substantially identical configuration and/or fulfil at least the same basic function are previously and subsequently provided with the same reference sign. In particular, if special reference is to be made to an alternative variant in an exemplary embodiment, a letter referring to the corresponding exemplary embodiment is appended as a suffix to the reference sign.

Figure 7:
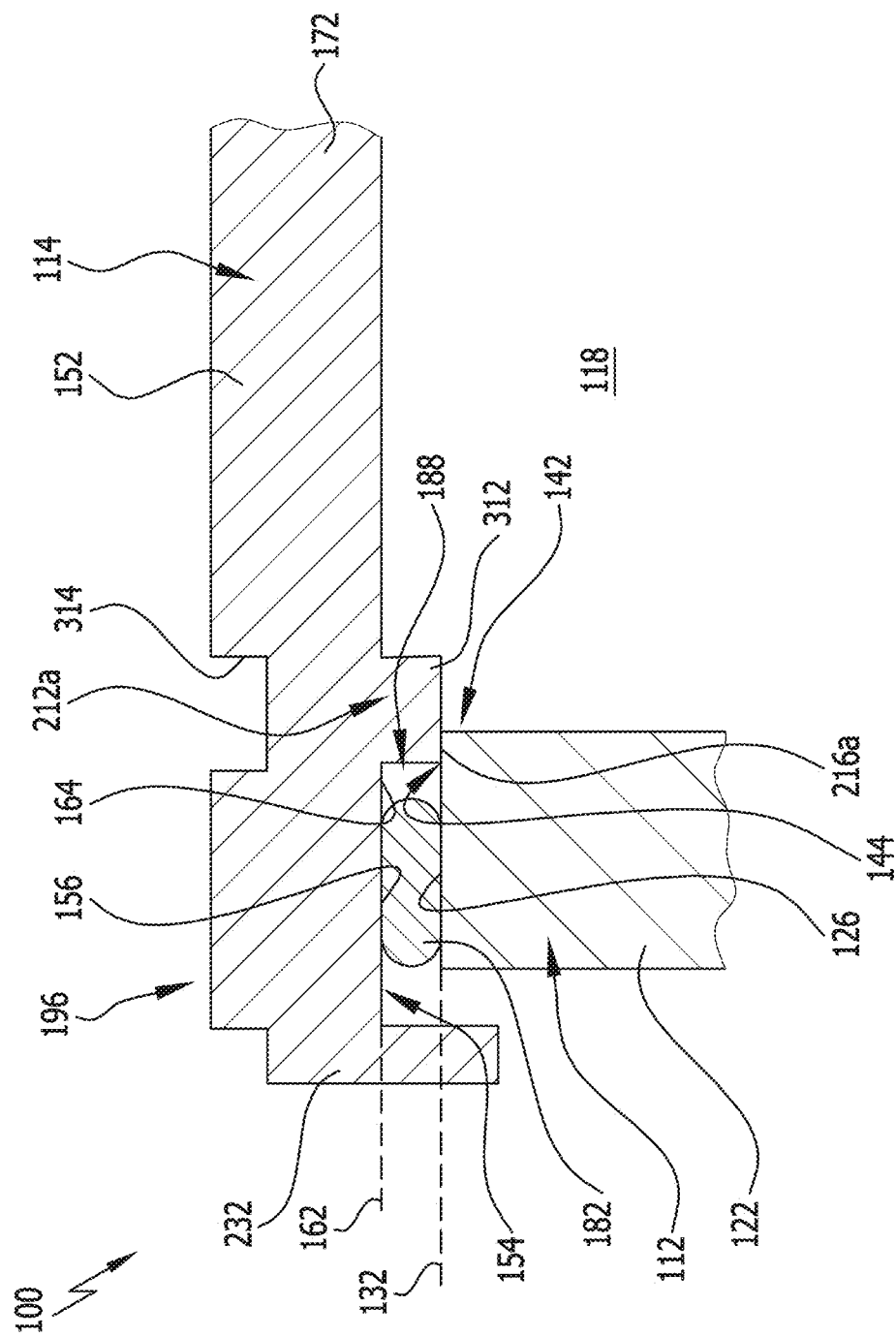
FIG. 7 shows a schematic sectional depiction of a connecting section of a second exemplary embodiment.

In the second exemplary embodiment, which is shown schematically in FIG. 7, the housing part 114, which in particular is lid-like, has at least one protective section in the form of a shielding section 212a, which is embossed in the housing part 114.

The embossed protective section, in this case the shielding section 212a, has an embossing part 312 protruding from the connecting side 154 and in particular beyond the geometric connection plane 162 and extending in the direction of the oppositely arranged housing part 112. In particular, the embossing part 312 is produced by embossing through the housing part 114, so that a side of the housing part 114 opposite the connecting side 154 has a groove 314 running opposite the embossing part 312 and formed in a manner corresponding thereto.

At its embossing part 312, the embossed section has a contacting face 216a, which faces the oppositely arranged housing part 112 and run, for example, at least approximately parallel to the geometric connection plane 162 and substantially along the connection contour 164. In the closed state, the contacting face 216a of the embossing part 312 contacts the oppositely arranged housing part 122 at least approximately completely along the connecting section 196, in particular at the inside edge section 144, the contacting face 216a preferably abutting at least partially on the connecting face 226, in particular under the application of a force.

Preferably, the embossed section is resilient, so that its spring effect contributes to a consistently good contact.

For example, the embossed section is formed as a bead.

Preferably, the embossed section 212a is arranged on the interior side and is supported, for example, on the inside edge section 144. In particular, the embossed section thus runs along the connecting face 156 and between the section 174, which has the connecting face 156, and the cover section 172 of the housing part 114.

It is particularly favourable if, in this exemplary embodiment, the housing part 114 also has an outside protective section formed as a cover section 232. This is preferably formed at least substantially as explained in conjunction with the first exemplary embodiment, and therefore full reference is made to those explanations.

Figure 8:
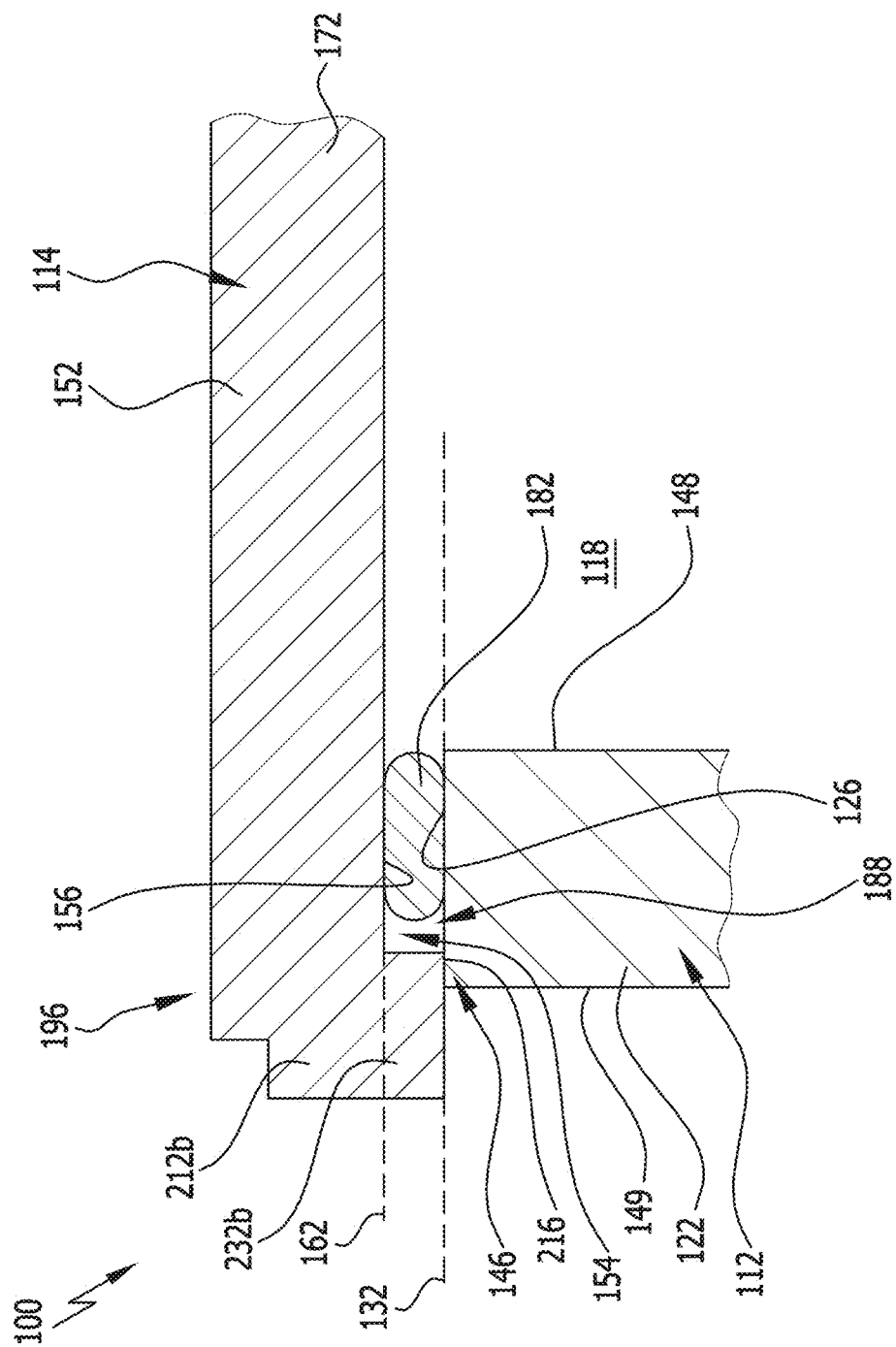
FIG. 8 shows a schematic sectional depiction of a connecting section of a third exemplary embodiment.

In a third exemplary embodiment, which is shown schematically in FIG. 8, the housing part 114, which is in particular lid-like, has a protective section which is formed as a combined shielding section 212b and cover section 232b and is provided on the outer side averted from the interior 118.

In some variants, this outside section is configured as a sheared-off edge of the housing part, in particular its outer wall 172. In other variants of the exemplary embodiment, this protective section is formed as a transformed section of the housing part 114, in particular its outer wall 172.

A part of the protective section 212b, 232b protrudes from the connecting side 154 of the housing part 114, in particular beyond the geometric connection plane 162, and extends in the direction of the oppositely arranged housing part 112, which this section 212b, 232b preferably contacts at least approximately continuously along the connecting section 196.

The protective section 212b, 232b has a contacting face 216 at which it contacts the oppositely arranged housing part 112. In the variant shown in FIG. 8 by way of example, the protective section 212b, 232b abuts with the contacting face 216 on at least part of the connecting face 126 of the oppositely arranged housing part 112, in particular under the application of a force.

In particular, the contacting face 216 of the protective section 212b, 232b abuts the outer edge section 146, for example at an outer edge thereof. In other variants, it is provided that the outside protective section 212b, 232b has an inwardly directed contacting face which contacts the outer wall section face 149 of the oppositely arranged housing part 112.

In particular, in the closed state the protective section 212b, 232b extends from its housing part 114 beyond its geometric connection plane 162 to at least the geometric connection plane 132 of the oppositely arranged housing part 112 and thus covers the gap 188 between the connecting faces 126 and 156 from the outside.

In this exemplary embodiment, too, a sealing element 182 is provided which, in the closed state, acts in a sealing manner between the connecting faces 126 and 156, and which is arranged relative to the protective section 212b, 232b on the inside towards the interior 118. In particular, the sealing element 182 is formed at least substantially the same as in the exemplary embodiments explained above, and therefore full reference is made to the explanations above with regard to advantageous configurations of said sealing element.

Figure 9:
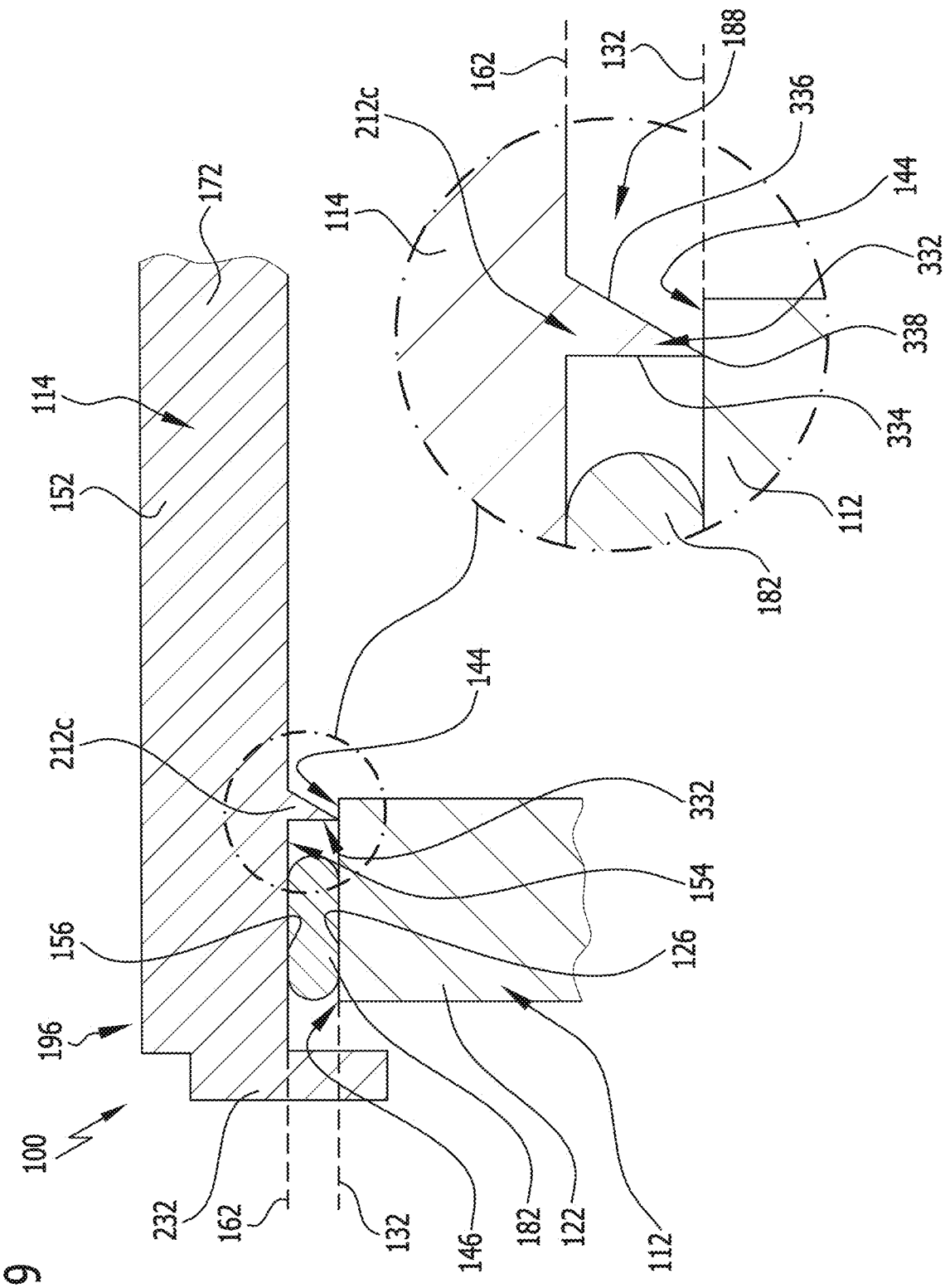
FIG. 9 shows a schematic sectional depiction of a connecting section of a fourth exemplary embodiment.

In a fourth exemplary embodiment, which is shown schematically by way of example in FIG. 9, the housing part 114, which is in particular lid-like, has a protective section which is configured as a shielding section 212c and has a bevelled edge 332, the edge 332 being pressed against the opposite housing part 112, in particular into the connecting face 126, in the closed state.

In particular, the section with the edge 332 on the connecting side 154 protrudes here beyond the connecting face 156 with an extent which is at least as great as a height extent of the gap 188 measured from one to the other housing part 112, 114 in the closed state. In particular, the extent of this spacing is at least as great as the spacing between the geometric connection planes 162, 132 in the closed state.

The section with the edge 332, said section being spike-like in cross-section, for example, has two apex faces 334, 336 which converge towards each other at the edge 332 and meet at a point at a protruding end of the edge 332 in an edge tip 338.

In the closed state, the protective section 212c thus extends from its housing part 114 to the opposite housing part 112 and is pressed onto the latter with the edge tip 338 and, in particular, is pressed into the opposite housing part with the edge tip 338 in the region of the connecting face 126. Thus, in the closed state, the section 212c having the edge bridges the gap 188 and preferably contacts the opposite housing part 112 at least approximately completely along the connecting section 196.

In this exemplary embodiment, the section 212c is arranged on the inside relative to the sealing element 182 and contacts the inside edge section 144. In other variants of the exemplary embodiment, it is provided that this section 212c is arranged with the edge 332 on the outside relative to the sealing element 182, for example contacting the outer edge section 146, and thereby alternatively or additionally acts as a cover section.

Preferably, in the exemplary embodiment, in particular in the variant with the inside section 212c with the edge 332, an outer protective section formed as a cover section 232 is additionally provided. In particular, this outer protective section is formed at least substantially as in one of the exemplary embodiments explained above with one or more of the features explained therein, and therefore full reference is made to the preceding explanations.

Figure 10:
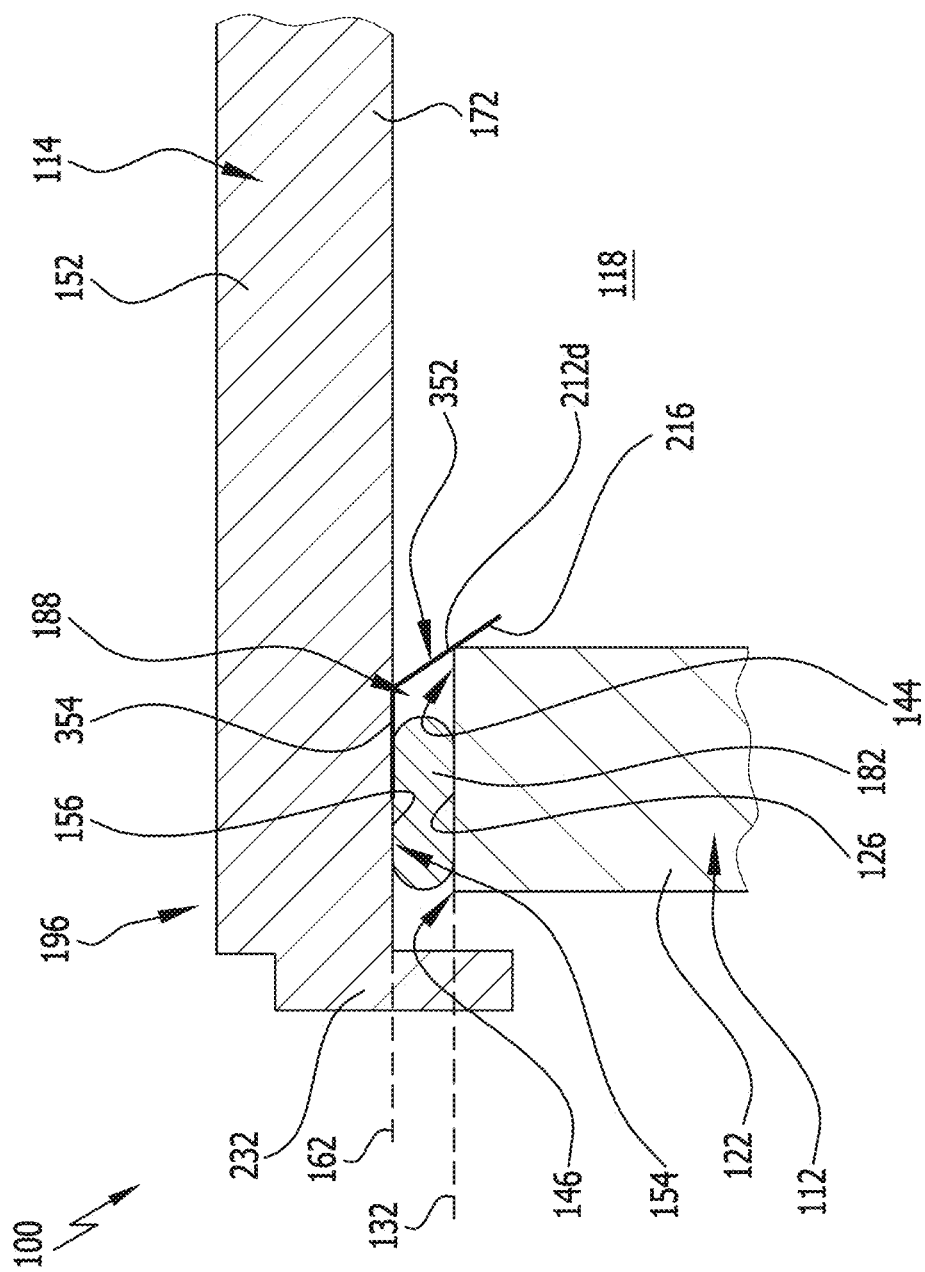
FIG. 10 shows a schematic sectional depiction of a connecting section of a fifth exemplary embodiment.

In a fifth exemplary embodiment, schematically shown in FIG. 10 by way of example, the integrated protective section is formed by a shielding section 212d of a protective element 352 which is connected to the housing part 114 and which is preferably a metal layer.

In this case, the metal layer has a retaining section 354, at which it is connected to the housing part 114 on the connecting side 154.

In particular, the retaining section 354 is flat and abuts the connecting face 156.

For example, the protective element 352 is connected to the housing part 114 merely by the application of the retaining section 354 by the sealing element 182, this being achieved in particular by the fastening means 252, although, in preferred variants of the exemplary embodiment, the protective element 352 is arranged captively on the, in particular lid-like, housing part 114, for example by welding, in particular by spot welding, already before the housing 100 is assembled.

The shielding section 212d is integrally formed on the retaining section 354 and is a transformed section of the metal layer forming the protective element 352.

In particular, the shielding section 212d is a section protruding obliquely from the retaining section 354.

The shielding section 212d extends from an end region abutting the housing part 114 away from the connecting side 154 of the housing part 114 to a second end region, with the extent of the shielding section 212d away from the housing part 114 being at least of such a magnitude that the second end region is remote from the connecting side 154 by at least the height extent of the gap 188 in the closed state.

The shielding section 212 has a contacting face 216 facing the opposite housing part 112 and contacts the housing part 112 at said contacting face at least approximately completely along the connecting section 196. For example, the protective element 352 is connected to the housing part 114 in such a way that, in the closed state, the contacting surface 216 of the protective element contacts the inside edge section 144, in particular an edge thereof, of the opposite housing part 112. In this case, it is favourable if the shielding section 212d, in the closed state, abuts the housing part 114 within the gap 188 and extends obliquely to the direction of the height extent of the gap 188 at least as far as the oppositely arranged housing part 112 and projects with an end region out of the gap 188 and, in so doing, contacts the opposite housing part 112 with the contacting face 216 facing the latter, in particular by applying force resiliently to said contacting face.

Preferably, the shielding section 212d is deformed, in particular elastically deformed, by the loading on the housing parts 112, 114 compared to an unloaded state.

The shielding section 212d is arranged on the interior side in the gap 188 and is thus arranged between a sealing element 182, arranged in the gap 188, and the interior 118. In variants of the exemplary embodiment, the shielding section 212d is correspondingly arranged on the outside, in particular contacting the outer edge section 146.

It is particularly favourable if the sealing element 182, on the one hand, sealingly abuts the connecting face 126 of the housing part 112 and, on the opposite side, partially sealingly abuts the connecting face 156 of the other housing part 114 and the retaining section 354 of the protective element 352.

Preferably, the housing part 114 further has a cover section 232, which in particular is formed at least substantially as in one of the exemplary embodiments explained above and in particular has one or more of the features explained in conjunction therewith, and therefore in this regard full reference is made to the explanations above.

Figure 11:
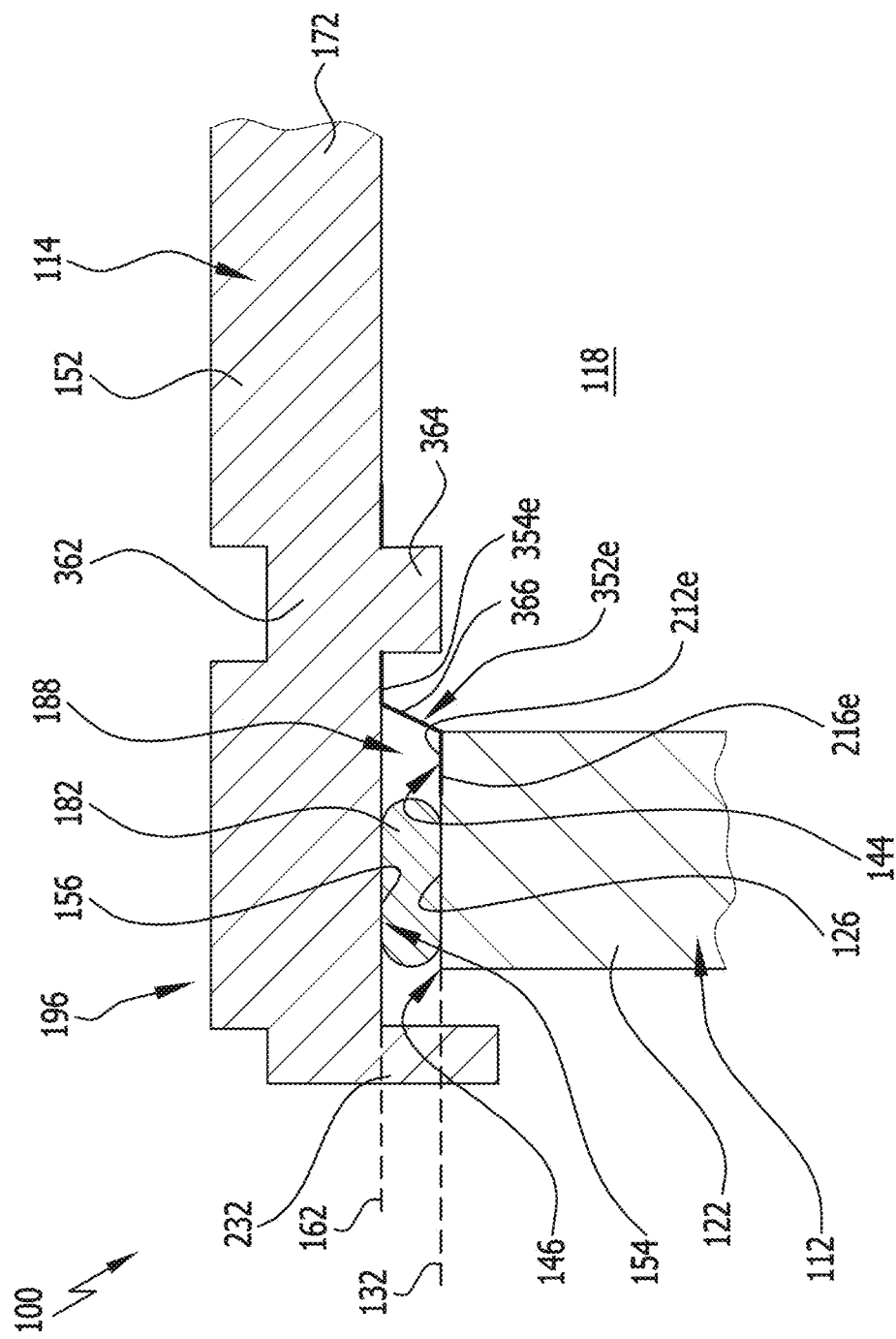
FIG. 11 shows a schematic sectional depiction of a connecting section of a sixth exemplary embodiment.
Figure 12:
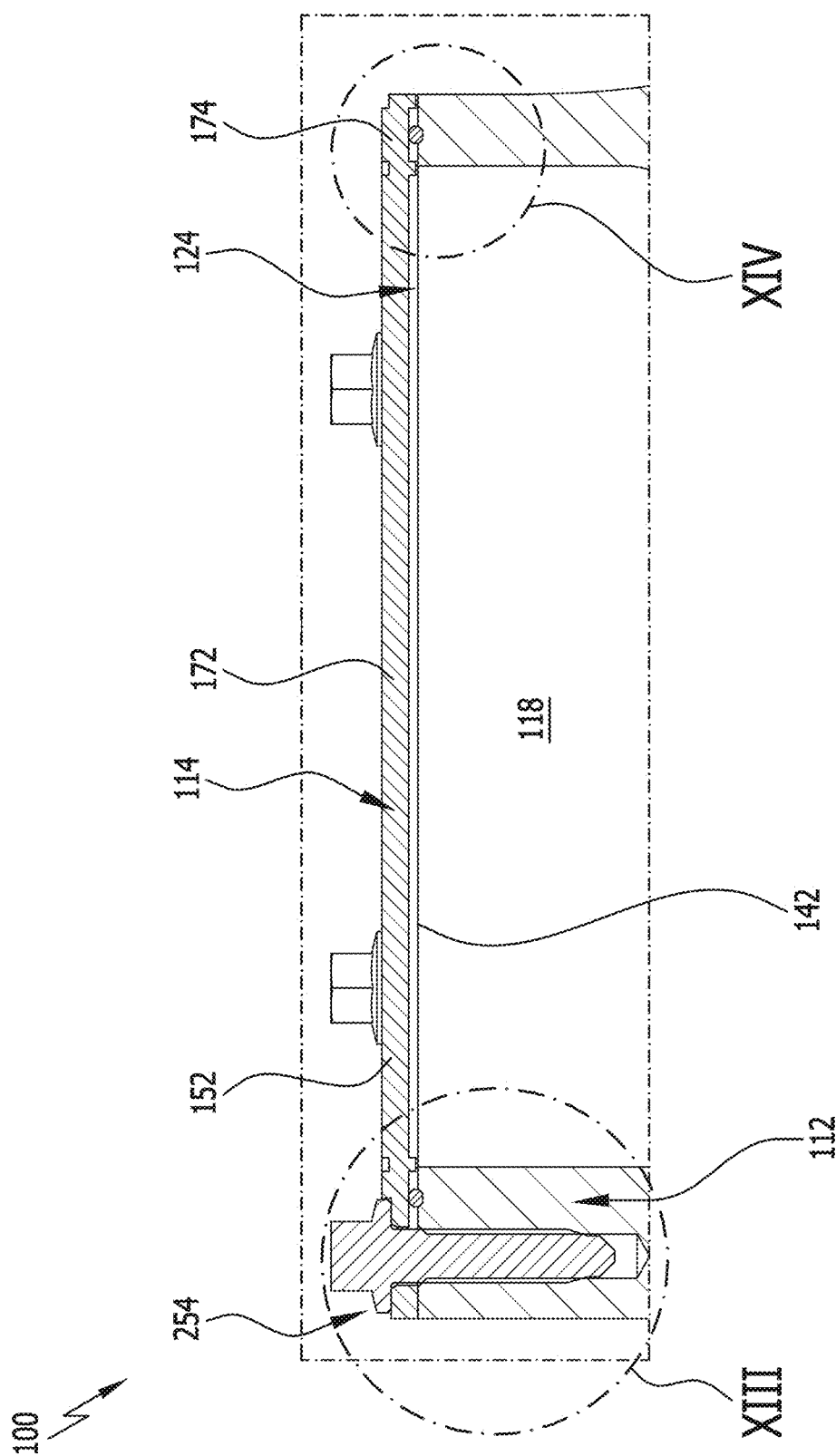
FIG. 12 shows a sectional depiction of a housing of a seventh exemplary embodiment.
Figure 13:
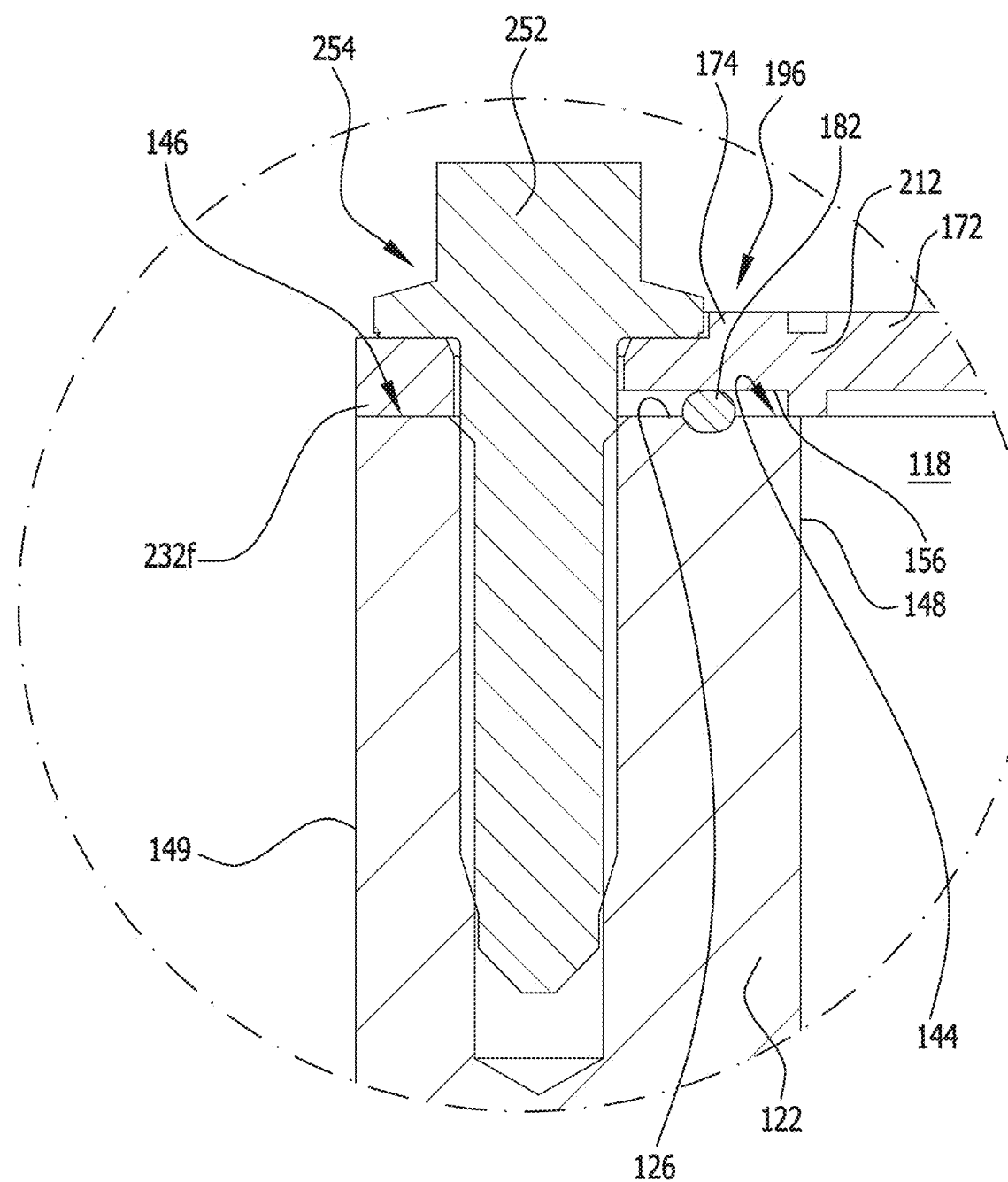
FIG. 13 shows a partial enlarged depiction of a region of a connecting section denoted by XIII in FIG. 12 with a fastening means.
Figure 14:
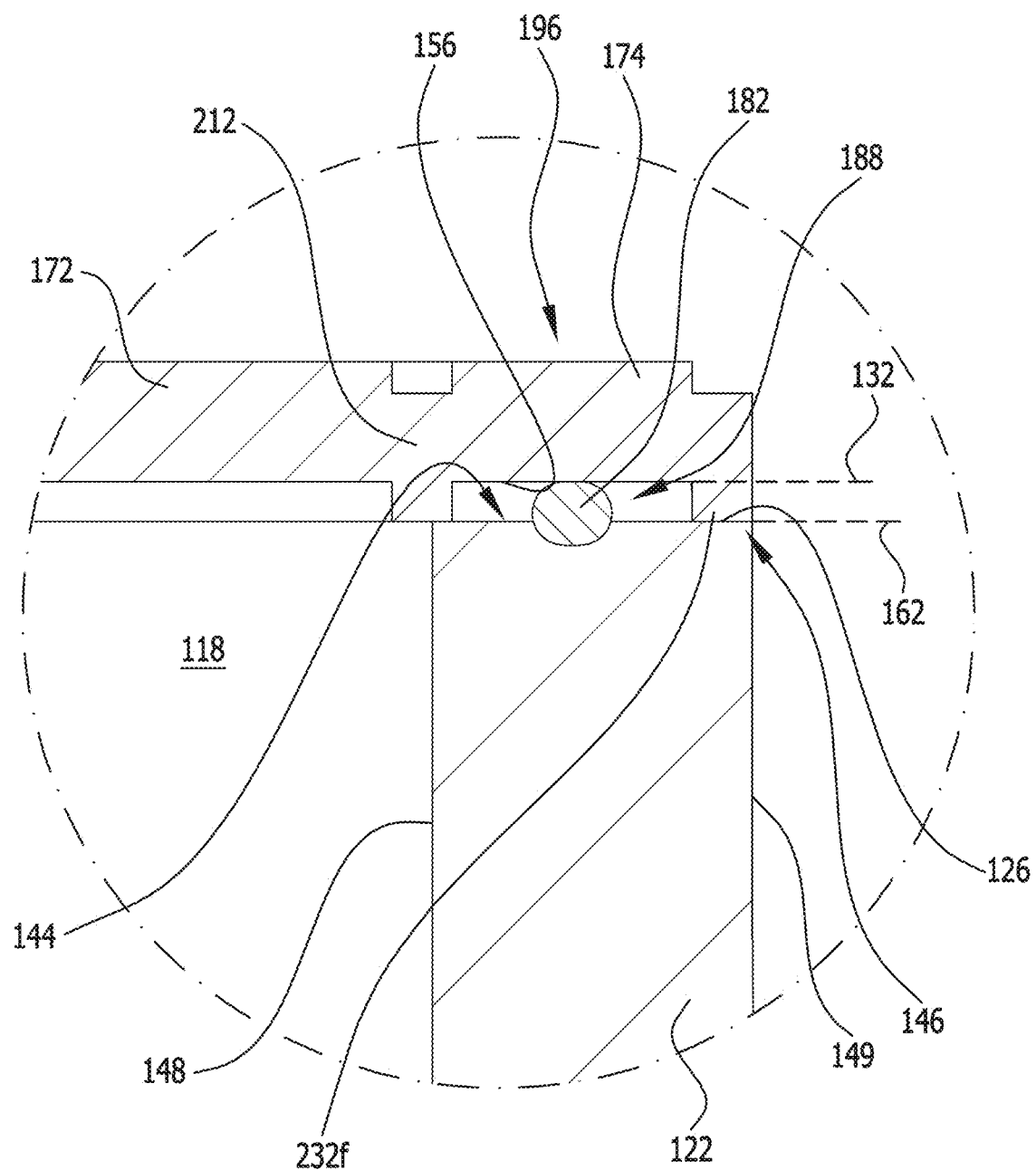
FIG. 14 shows a partial enlarged depiction of a region of the connecting section denoted by XIV in FIG. 12.

In a sixth exemplary embodiment, which is shown schematically by way of example in FIG. 11, a protective element 352e forming the integrated protective section is connected to the housing part 114, in particular by means of clinching. The protective element 352e is preferably formed from a flat metal material.

In this case, a retaining section 354e of the protective element 352e abuts a joining section 362 of the housing part 114 on the connecting side 154 thereof, and in this region the retaining section 354e and the joining section 362e are at least partially connected to one another in a force-locking and/or positively-locking manner.

In particular, the joining section 362 is a transformed section of the housing part 114, the latter having material accumulations 364 at joining points on the connecting side 154 which bulge out from the connecting side 154 and form the connection to the retaining section 354e, and in particular having corresponding channels at the joining points on a side opposite the connecting side 154. In particular, the retaining section 354e has apertures through which the material accumulations 364 engage and are surrounded on both sides in order to produce the captive connection.

For example, the joining section 362 is part of the cover section 172. In other favourable variants of the exemplary embodiment, the joining section 362 is arranged between the cover section 172 and the section 174 of the housing part 114 forming the connecting face 176.

Furthermore, the protective element 352e has a protective section, which is in the form of a shielding section 212e and in particular abuts with a contacting face 216e over the entire surface on the connecting face 126 of the oppositely arranged housing part 112, in particular on the inside edge section 144. In particular, the retaining section 354e and the shielding section 212e are connected to each other by means of a bridging section 366 bridging the spacing between the housing parts 114 and 112. Preferably, the retaining section 354e and the shielding section 212e extend at least approximately parallel to each other and the bridging section 366 extends obliquely to these sections 354e, 212e, between them, and transitions into them at edge sections. In particular, the protective element 352 thus has a half bead along the connecting section 196 in this exemplary embodiment, with the bead feet forming the edge sections.

It is particularly favourable if the retaining section 354e and the shielding section 212e have a greater spacing, which is measured in particular at least approximately perpendicularly to their substantially parallel extent, in a state with clearance than in the closed state of the housing 100, so that this region of the protective element 352, preferably at the bridging section 366, is in particular elastically deformed in the closed state and abuts the housing parts 114 and 112 in a loading manner.

The protective element 352e is arranged on the interior side between the housing parts 114 and 112 and at least the shielding section 212e projects into the gap 188. Thus, the protective element 352e is arranged between the interior 118 and a sealing element 182 arranged in the gap 188.

In the closed state of the housing 100, the sealing element 182 sealingly abuts the connecting faces 126 and 156 of the two housing parts 112, 114, and in some variants of the exemplary embodiment also abuts the protective element 352e, in particular the shielding section 212e.

The sealing element 182 is in particular configured at least substantially as in the exemplary embodiments explained above and in particular has one or more of the features explained above, and therefore in this regard full reference is made to the above explanations.

In addition, the housing part 114 preferably has a protective section which is in the form of a cover section 232 and is arranged on the outside and, in particular, is formed at least substantially as in the exemplary embodiments explained above and preferably has one or more of the features explained therein, and therefore in this regard full reference is made to the above explanations.

In all other respects, unless otherwise explained and/or explained in more detail in conjunction with one of the preceding exemplary embodiments, elements and features are configured as in another of the exemplary embodiments explained above, in particular as in exemplary embodiment 1, and therefore full reference is made to the respective explanations.

In particular, for example inside and outside protective sections, in particular cover sections and shielding sections, which have been explained in conjunction with different exemplary embodiments, can be combined with each other.

A seventh exemplary embodiment of a housing denoted as a whole by 100, shown by way of example in FIGS. 12 to 15, comprises at least two housing parts 112, 114, which again define an interior 118.

The first housing part 112 again comprises an outer wall 122, which extends at a connecting side 124 to a connecting face 126. In particular, the connecting face 126 extends between an inside edge section 144 facing the interior 118 to an edge section 146 running on an opposite side, which is in particular an outer side of the housing. In particular, the connecting face 126 extends substantially in a geometric connection plane 132.

The outer wall 122 extends away from the connecting face 126 and has an inside wall section face 148 delimiting the interior 118 and, on an opposite side, an outer wall section face 149, which run at least approximately parallel to one another, for example in a connection end region arranged on the connecting side 124, and extend away at least approximately perpendicularly from the geometric connection plane 132.

At the inside edge section 144, the inside wall section face 148 abuts the connecting face 126, and at the outside edge section 146 the outer wall section face 149 abuts the connecting face 126, particularly in an edge-like manner.

The connecting face 126 runs along a connection contour 134 and delimits a housing part opening 142 which adjoins the inside edge section 144 on the interior side, and, in particular, the connection contour 134 and thus the connecting face 126 run circumferentially in a closed manner around the housing part opening 142.

For example, the housing part 112 is a cast part, in particular with a milled connecting face 126.

The second housing part 114 also has an outer wall 152, which at least partially delimits the interior 118 and, in particular, in a closed state of the housing, closes the housing part opening 142 in a lid-like manner. This outer wall 152 of the housing part 114 also has, on a connecting side 154, a connecting face 156 which runs along a connection contour 164, the connection contour 164 running correspondingly to the connection contour 134 of the oppositely arranged housing part 112, so that the two connecting faces 156, 126 of these housing parts 114, 112 face one another along a connecting section 196 in the closed state of the housing.

With a cover section 172, the outer wall 152 in the closed state delimits the housing part opening 142 of the oppositely arranged housing part 112, wherein the cover section 172 is in particular circumferentially framed by the section 174 with the connecting face 156.

In particular, this housing part 114 is formed substantially as a flat housing part 114 which extends substantially parallel to a geometric connection plane 162 in which, in particular, the connecting face 156 runs, and an extent of this flat housing part 114 perpendicular to the geometric connection plane 162 is substantially less than the extent of said flat housing part parallel to the geometric connection plane 162.

Preferably, the housing part 144, which is in particular lid-like, is formed from a metal material, in particular a sheet metal.

In the closed state of the housing 100, there is a gap 188 between the two connecting faces 126, 156 of the housing parts 112, 114, the height dimension of said gap corresponding substantially to a spacing between the two connecting faces 126, 156.

To seal the gap 188, a sealing element 182 is provided therein and extends in particular along the connection contours 134, 164 along the connecting section 196 and sealingly abuts the connecting faces 126 and 156 on one side each.

For example, the sealing element 182 abuts flat sections of the connecting faces 126, 156. In variants, a groove, in which the sealing element 182 is partially received, is provided on a connecting face 126, 156, in particular the connecting face 126 of the cast housing part 114.

For protection, in particular against external influences, the housing part 114, which in particular is lid-like, has a protective section which runs in particular circumferentially at the edge and is formed as a cover section 232f.

Preferably, sections of the cover section 252f are also arranged at the fastening points 254 around the apertures for the fastening means 252 and frame the various apertures at least at the outside and partially completely. In particular, the fastening points 254 on the lid-like housing part 114 are formed as flange projections.

In this case, this cover section 232f does not run circumferentially in a closed manner along the connection contour 164, but extends only in sections along this contour 164 along the connecting section 196. Recesses 372 are provided between the individual sections of the cover section 232f.

Figure 15:
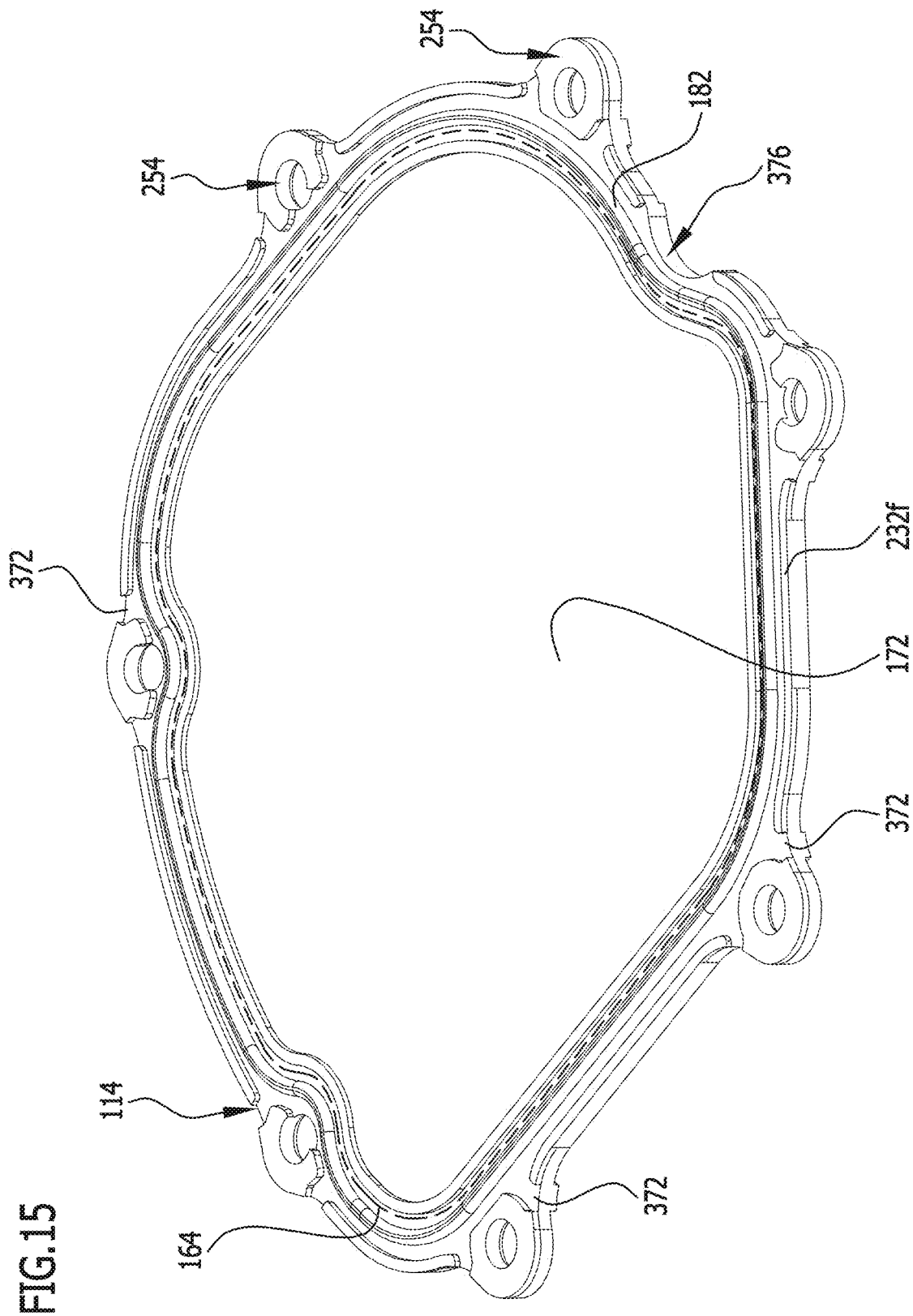
FIG. 15 shows a perspective depiction of a housing part, in particular a lid-like housing part, of the seventh exemplary embodiment, and FIG. 16a) and b) show a partial enlarged depiction of a variant of the housing part in accordance with FIG. 15 in the region of, in particular lid-like, overlapping protective sections.

In particular, the recesses are provided in the region of the fastening points 254, as for example in the variant of the exemplary embodiment shown in FIG. 15. In this case, the recesses are arranged in each case between a section framing a corresponding aperture at least at the outside and a section of the cover section 232f running in particular continuously between two adjacent fastening points. Preferably, these recesses are large enough, for example, to allow moisture to escape and to avoid a capillary effect, but as small as possible to keep an interruption of the protection as low as possible.

For example, in an adjoining region 376, in which another component adjoins the housing on the outside, the outer cover section 232f is also interrupted with a recess, since in this region external protection, in particular mechanical protection, is already provided by the adjoining component.

Figure 16B:
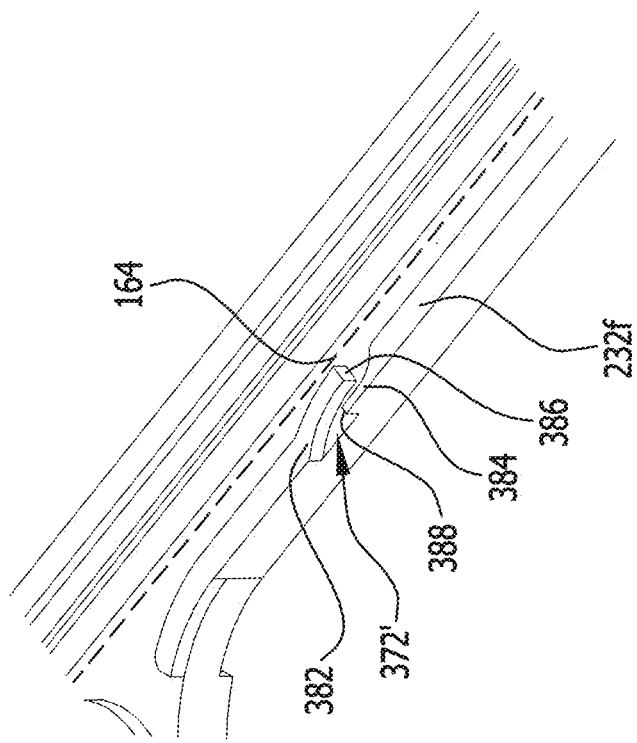
Figure 16A:
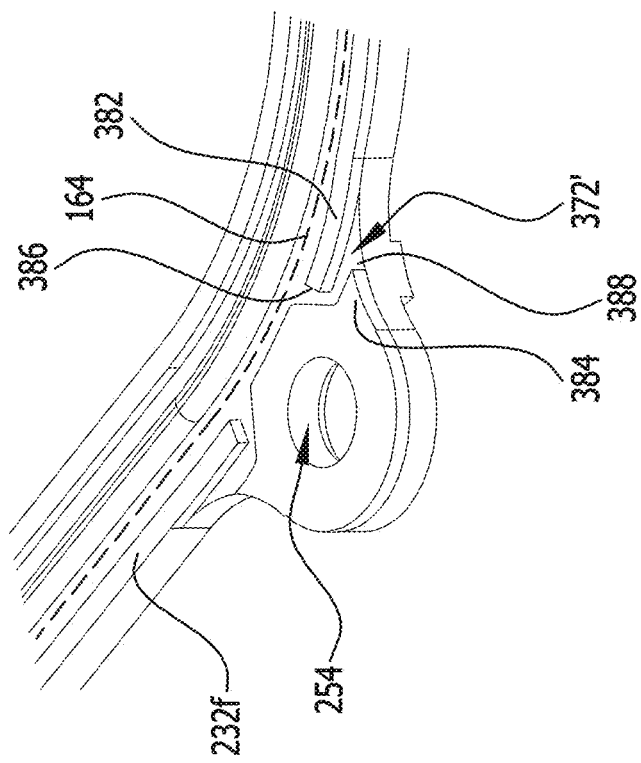

In variants of the exemplary embodiment, as shown by way of example in FIG. 16a) and b), at least some recesses are formed in a twisted manner.

Here, two partial sections 382 and 384 of the protective section 232f run in the region of the recess 372' substantially along the connection contour 164 but offset to each other transversely thereto. Thus, a free space of the recess 372' in the region of the offset course of the two partial sections 382, 384 runs substantially along the connection contour 164, specifically substantially from one end 386 of one partial section 382 to one end 384 of the other partial section 388. At each of the ends 386 and 388, the recess 372' opens to one transverse side each of the protective section 232f, with one transverse side here facing the sealing element 182 and the other transverse side facing outwards. Thus, also in the region of the recess 372', the protective section 232f does not have a free passage running at least approximately perpendicularly to its longitudinal extent or at least approximately perpendicularly to the connection contour 164, and therefore preferably also in this region the sealing element arranged further inwards is protected from external damaging effects, such as liquid jets of a high-pressure cleaner during cleaning.

For example, the angled recesses 372' are provided between two fastening points and preferably in the region of a fastening point 254, so that at least one of the sub-sections, for example the sub-section 384, is formed by a section of the protective section 232f at least partially surrounding an aperture.

The sections of the cover section 232f rest on the connecting face 126 of the oppositely arranged housing part 112, specifically on the outside, so that the sealing element 182 is arranged between the interior 118 and the cover section 232f. In particular, the sections of the cover section 232f abut on the outer edge section 146 and are flush with the outer wall 122, in particular the outer wall section face 149 of the oppositely arranged housing part 112.

In this exemplary embodiment, the cover section 232f is formed as a transformed section of the housing part 114, in particular the sections thereof are embossed sections.

In variants of the exemplary embodiment, the sections of the cover section 232f are alternatively or additionally formed with features explained in conjunction with the protective sections in the other exemplary embodiments.

In another variant, the cover section 232f runs continuously along the connecting section 196, for example circumferentially in a closed manner around the housing part opening 142.

Preferably, a protective section in the form of a contacting section 212 is also provided on the inside in the case of this housing 100 and in particular contacts the inside edge section 144. With regard to the configuration of this contacting section, full reference is made to the preceding explanations for the exemplary embodiment with the embossed contacting section. In variants of the exemplary embodiment, the contacting section 212 is formed as in another of the exemplary embodiments described above, and therefore in respect of these variants full reference is made to the explanations above.

Furthermore, features which have been explained in conjunction with this seventh exemplary embodiment, in particular with regard to the housing and its at least two housing parts 112, 114 and/or the protective section which is formed as a cover section 232f and which in particular terminates flush with the oppositely arranged housing part, can also be transformed to the other exemplary embodiments explained above and/or combined with features and configurations which have been explained in conjunction with these preceding exemplary embodiments.

Moreover, features and elements not explained in greater detail in one exemplary embodiment are preferably formed as in another of the exemplary embodiments explained above, and therefore full reference is made to the corresponding explanations.

The invention claimed is:

1. A housing comprising at least two housing parts which each have a connecting face, said connecting faces, in a closed state of the housing, facing one another along a connecting section, wherein at least one of the at least two housing parts, along the connecting section, has at least one integrated protective section, wherein at least partially along the connecting section, the at least one integrated protective section externally covers a gap between the at least two housing parts, wherein the at least two housing parts surround an interior of the housing and abut each other at an abutment in a geometric connection plane, wherein the gap extends radially outward to the at least one integrated protective section, wherein the at least one integrated protective section extends axially to the geometric connection plane or beyond the geometric connection plane so as to externally cover the gap.

2. The housing in accordance with claim 1, wherein at least one protective section is provided along the connecting section for at least one of EMC shielding and/or mechanical protection.

3. The housing in accordance with claim 1, wherein at least one protective section is arranged captively on one of the housing parts.

4. The housing in accordance with claim 1, wherein a section of the one housing part forms at least one protective section.

5. The housing in accordance with claim 1, wherein at least one protective section is a transformed section of the one housing part.

6. The housing in accordance with claim 1, wherein at least one protective section is a section integrally formed on the one housing part.

7. The housing in accordance with claim 1, wherein at least one protective section is formed by a protective element associated with one housing part.

8. The housing in accordance with claim 7, wherein the protective element is connected to the one housing part by at least one of clinching and/or a substance-to-substance bond.

9. The housing in accordance with claim 7, wherein the protective element is formed from a metal material.

10. The housing in accordance with claim 1, wherein at least one protective section has an edge, which protrudes beyond a connecting side of the housing part that has this protective section.

11. The housing in accordance with claim 1, wherein at least one protective section is formed by a bead.

12. The housing in accordance with claim 1, wherein at least one protective section is spring-mounted.

13. The housing in accordance with claim 1, wherein at least one protective section is resiliently connected to a section forming at least one of a connecting face and/or a retaining section.

14. The housing in accordance with claim 1, wherein at least one protective section, in the closed state of the housing, at least partially abuts the connecting face of the oppositely arranged housing part.

15. The housing in accordance with claim 1, wherein at least one protective section, in the closed state of the housing, at least partially abuts a wall section face of the oppositely arranged housing part, the wall section face extending away from a connecting face.

16. The housing in accordance with claim 1, wherein at least one protective section along the connecting section is spaced at least partially from the oppositely arranged housing part.

17. The housing in accordance with claim 1, wherein at least one protective section along the connecting section has one or more recesses, wherein the at least one protective section has two partial sections which run offset to each other transversely to the connection contour and the recess runs between the two partial sections in the region of the offset course.

18. The housing in accordance with claim 1, wherein at least one protective section is arranged on the inside along the connecting section.

19. The housing in accordance with claim 1, wherein at least one protective section is arranged on the outside along the connecting section.

20. The housing in accordance with claim 1, wherein at least along the connecting section at least one protective section abuts the oppositely arranged housing part under force.

21. The housing in accordance with claim 1, wherein at least along the connecting section at least one protective section at least partially adapts to the oppositely arranged housing part by plastic deformation.

22. The housing in accordance with claim 1, wherein at least in the closed state, a sealing element is arranged between the two connecting faces of the at least two housing parts.

23. The housing in accordance with claim 22, wherein at least one protective section is arranged on the inside and/or outside relative to the sealing element.

24. The housing in accordance with claim 22, wherein a retaining section and the sealing element are arranged together on one of the housing parts, and the retaining section is held between the one housing part and the sealing element.

25. An electrotechnical apparatus, which comprises a housing in accordance with claim 1, wherein at least one electrical component of the electrotechnical apparatus being arranged in an interior of the housing.

26. A motor vehicle component which comprises a housing in accordance with claim 1.

27. A motor vehicle which comprises at least one of a housing in accordance with claim 1.

28. A motor vehicle which comprises an electrotechnical apparatus in accordance with claim 25.

29. A motor vehicle which comprises a motor vehicle component in accordance with claim 26.

30. The housing in accordance with claim 1, wherein the at least two housing parts abut each other at the abutment directly or via a protective element.

\* \* \* \* \*